US009466351B2

(12) United States Patent
Jeong

(10) Patent No.: US 9,466,351 B2
(45) Date of Patent: Oct. 11, 2016

(54) SEMICONDUCTOR MEMORY DEVICE AND METHOD FOR REFRESHING MEMORY CELLS

(71) Applicant: Samsung Electronics Co., Ltd., Suwon-si (KR)

(72) Inventor: In Chul Jeong, Gyeonggi-do (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/681,088

(22) Filed: Apr. 8, 2015

(65) Prior Publication Data

US 2015/0213871 A1  Jul. 30, 2015

Related U.S. Application Data

(62) Division of application No. 13/787,813, filed on Mar. 7, 2013, now Pat. No. 9,025,405.

(30) Foreign Application Priority Data

Apr. 18, 2012  (KR) ........................ 10-2012-0040114

(51) Int. Cl.
*G11C 7/00*      (2006.01)
*G11C 11/406*    (2006.01)
*G11C 11/402*    (2006.01)
*G11C 11/408*    (2006.01)

(52) U.S. Cl.
CPC ............ *G11C 11/406* (2013.01); *G11C 11/402* (2013.01); *G11C 11/408* (2013.01); *G11C 11/40611* (2013.01); *G11C 2211/4061* (2013.01)

(58) Field of Classification Search
CPC .................. G05B 2119/34193; G09G 3/3618; G11C 11/401; G11C 11/403; G11C 11/402; G11C 11/40607; G11C 11/40611; G11C 13/0033
USPC .................................................. 365/222, 149
See application file for complete search history.

(56) References Cited

U.S. PATENT DOCUMENTS

| 5,623,451 | A | 4/1997 | Kawagoe |
| 5,644,545 | A | 7/1997 | Fisch |
| 7,095,669 | B2 | 8/2006 | Oh |
| 7,565,479 | B2 * | 7/2009 | Best ...................... G11C 11/406 711/103 |
| 2012/0300568 | A1 | 11/2012 | Park et al. |
| 2014/0293725 | A1 * | 10/2014 | Best ...................... G11C 11/406 365/222 |

FOREIGN PATENT DOCUMENTS

| JP | 05-044773 | 2/1994 |
| KR | 10-1999-0013963 A | 2/1999 |
| KR | 10-2000-0043229 A | 7/2000 |
| KR | 10-2006-0080331 A | 7/2006 |

* cited by examiner

*Primary Examiner* — Huan Hoang
(74) *Attorney, Agent, or Firm* — Muir Patent Law, PLLC

(57) ABSTRACT

A semiconductor memory device is provided. The semiconductor memory device includes a memory block including a plurality of memory cells; a default refresh controller configured to receive a refresh command from a host, to generate a default refresh signal, and to control the memory cells to be refreshed; and a weak cell refresh controller configured to receive the default refresh signal, to generate a weak cell refresh signal, and to control a weak cell among the memory cells to be refreshed. The weak cell may be refreshed at least one more time during a refresh period during which all of the memory cells are refreshed by the default refresh controller. The semiconductor memory device performs at least one more refresh on a weak cell having a data retention time shorter than a refresh period apart from a normal default refresh, thereby preventing data loss.

10 Claims, 18 Drawing Sheets

FIG. 5

| | RA0 | RA1 | RA2 | |
|---|---|---|---|---|
| 0 | 0 | 0 | 0 | |
| 1 | 1 | 0 | 0 | ← Weak Cell |
| 2 | 0 | 1 | 0 | |
| 3 | 1 | 1 | 0 | |
| 4 | 0 | 0 | 1 | |
| 5 | 1 | 0 | 1 | |
| 6 | 0 | 1 | 1 | |
| 7 | 1 | 1 | 1 | |

Exclusion Bit (↓ pointing to RA2 column)

SEMICONDUCTOR MEMORY DEVICE AND METHOD FOR REFRESHING MEMORY CELLS

CROSS-REFERENCE TO RELATED APPLICATIONS

This application is a Divisional Application of and claims priority to U.S. patent application Ser. No. 13/787,813, filed on Mar. 7, 2013, which claims priority under 35 U.S.C. §119(a) from Korean Patent Application No. 10-2012-0040114 filed on Apr. 18, 2012, the disclosure of each of which is hereby incorporated by reference in its entirety.

BACKGROUND

A semiconductor memory device may improve its performance by controlling the refresh of weak cells having a short data retention time.

Semiconductor memory, such as dynamic random access memory (DRAM), may use a method of recording data by accumulating charge in a capacitor of a memory cell. The charge of the capacitor is lost in form of leakage current over time. To avoid data loss due to the leakage current, DRAM implements a refresh operation to read data from a cell and rewrite the read data in the cell before the data is lost completely.

The refresh operation may be carried out periodically or at the request of a system. Since capacitors of different cells may have different retention performances, e.g., different data retention times, a refresh operation taking into account such differences is desired.

SUMMARY

According to some embodiments, semiconductor device may comprise a memory block comprising a plurality of volatile memory cells; a default refresh controller responsive to a series of refresh commands received externally with respect to the semiconductor memory device, each of the refresh commands targeting a corresponding memory cell group of the volatile memory cells of the memory block to be refreshed, the default refresh controller configured, in response to each of the received refresh commands, to control at least one default refresh operation corresponding to each of the refresh commands for the respective memory cell group targeted by the corresponding refresh command; and a weak cell refresh controller configured to control at least one refresh operation of weak cell memory groups including a first memory cell group, the weak cell refresh controller responsive to a received refresh command that targets a memory cell group different from the first memory cell group and does not target the first memory cell group to control at least one refresh operation of the first memory cell group.

The semiconductor memory device may comprise a weak cell memory configured to store weak cell information to identify the weak cell memory groups including the first memory cell group, the weak cell memory being configured to communicate with the weak cell refresh controller.

The default refresh controller may be configured to process default address information identifying the corresponding memory cell group to be refreshed as part of the at least one default refresh operation.

The weak cell refresh controller may comprise an address comparator configured to compare the default address with the weak cell information and to generate an address comparison result; and a refresh determinator configured to receive the address comparison result from the address comparator and to generate a weak cell refresh enable signal to enable the refresh of the first memory cell group.

The weak cell information may comprise weak cell addresses of the weak cell memory groups, including a first weak cell address identifying the first memory cell group.

The address comparator may generate a first address comparison result when the default address is different from the address of the first memory cell group.

The refresh determinator may be configured generate the weak cell refresh enable signal to control a refresh operation of the first memory cell group in response to an address comparison result of the address comparator indicating bits other than a most significant bit of the first weak cell address are the same.

The refresh determinator may generate the weak cell refresh enable signal so that a refresh operation responsive to the weak cell refresh enable signal is performed a predetermined period of time after a start of a default refresh operation corresponding to the default address information.

The address comparator may be configured to compare the default address with a plurality of addresses stored in the weak cell memory and to provide an address comparison result enabling a refresh operation of a weak cell group corresponding to one of the plurality of addresses upon determining only a partial match of the one of the plurality of addresses with the default address.

The weak cell memory may store weak cell refresh information indicating a location of a weak cell refresh operation within a sequence of default refreshes controlled by the default refresh controller.

A counter may be configured to count a number of the refresh commands received by the semiconductor memory device, wherein the weak cell refresh controller is configured to control a refresh operation of a weak cell memory group in response to the count of the counter.

The weak cell refresh controller may be configured to control a refresh operation of the first memory cell group N counts after a receipt of an external refresh command targeting the first memory cell group, where N is an integer.

A retention time of a subset of the plurality of volatile memory cells may be equal to or greater than a first time period. The default refresh controller may be configured to control a default refresh operation for each of the subset of the plurality of volatile memory cells once every block refresh period having a length equal to the first time period. The weak cell refresh controller is configured to control the at least one refresh operation of the weak cell memory groups so that the weak cell memory groups are refreshed at least two times every block refresh period.

Embodiments contemplate a method of refreshing a memory device that may comprise a plurality of volatile memory cells and a nonvolatile memory storing at least a first address, the first address identifying a first group of the plurality of volatile memory cells.

The method may comprise receiving a series of refresh commands from a source external to the memory device, each of the refresh commands identifying a group of volatile memory cells to be refreshed; in response to each of the series of refresh commands, refreshing the group of volatile memory cells identified by the corresponding refresh command; and in response to a first refresh command of the series of refresh commands and in response to accessing the first address stored in the nonvolatile memory, refreshing the first group of volatile memory cells. The first refresh command may identify a second group of volatile memory cells other than the first group of volatile memory cells.

The method may comprise comparing an address received with a received refresh command with the first address.

The nonvolatile memory may store information indicating a place of an additional refresh operation of the first group of volatile memory cells within a refresh sequence.

The refreshing of the first group of volatile memory cells may be performed a predetermined period of time after a refresh of the second group of volatile memory cells.

A method of refreshing a volatile memory device is provided. The memory device may comprise a plurality of cell rows of volatile memory cells and a weak cell memory storing address information identifying weak cell rows of the plurality of cell rows. The method may comprise during a first period having a first duration: (a) for each of the plurality of cell rows, in response to receiving an external refresh command including an address identifying the cell row, performing a default refresh operation of the cell row corresponding to the address of the received refresh command; and (b) for each of the weak cell rows identified by address information stored in the weak cell memory, performing a refresh operation of the respective weak cell row in addition to the default refresh operation performed in step (a).

The method may also comprise (c) for each of the received external refresh commands, determining if the address received with the respective external refresh command is at least partly matching with an address of the weak cell rows.

Step (b) may perform the refresh operation of the respective weak cell row in response to step (c).

Step (c) may comprise comparing address bits except the most significant bit of the address received with the respective external refresh command with address bits except the most significant bit of the address of each of the weak cell rows.

The method may comprise modifying a count in response to the receipt of the external refresh commands received during the first period. The timing of the refresh operation of the respective weak cell row of step (b) may be responsive to the count.

The method may comprise, during a second period of the first duration immediately following the first period, repeating steps (a) and (b).

BRIEF DESCRIPTION OF THE DRAWINGS

The above and other features and advantages of the inventive concept will become more apparent by describing in detail exemplary embodiments thereof with reference to the attached drawings in which:

FIG. 5 is a table for explaining exemplary detail of an operation of the semiconductor memory device illustrated in FIG. 3;

DETAILED DESCRIPTION OF THE EMBODIMENTS

Figure 1:
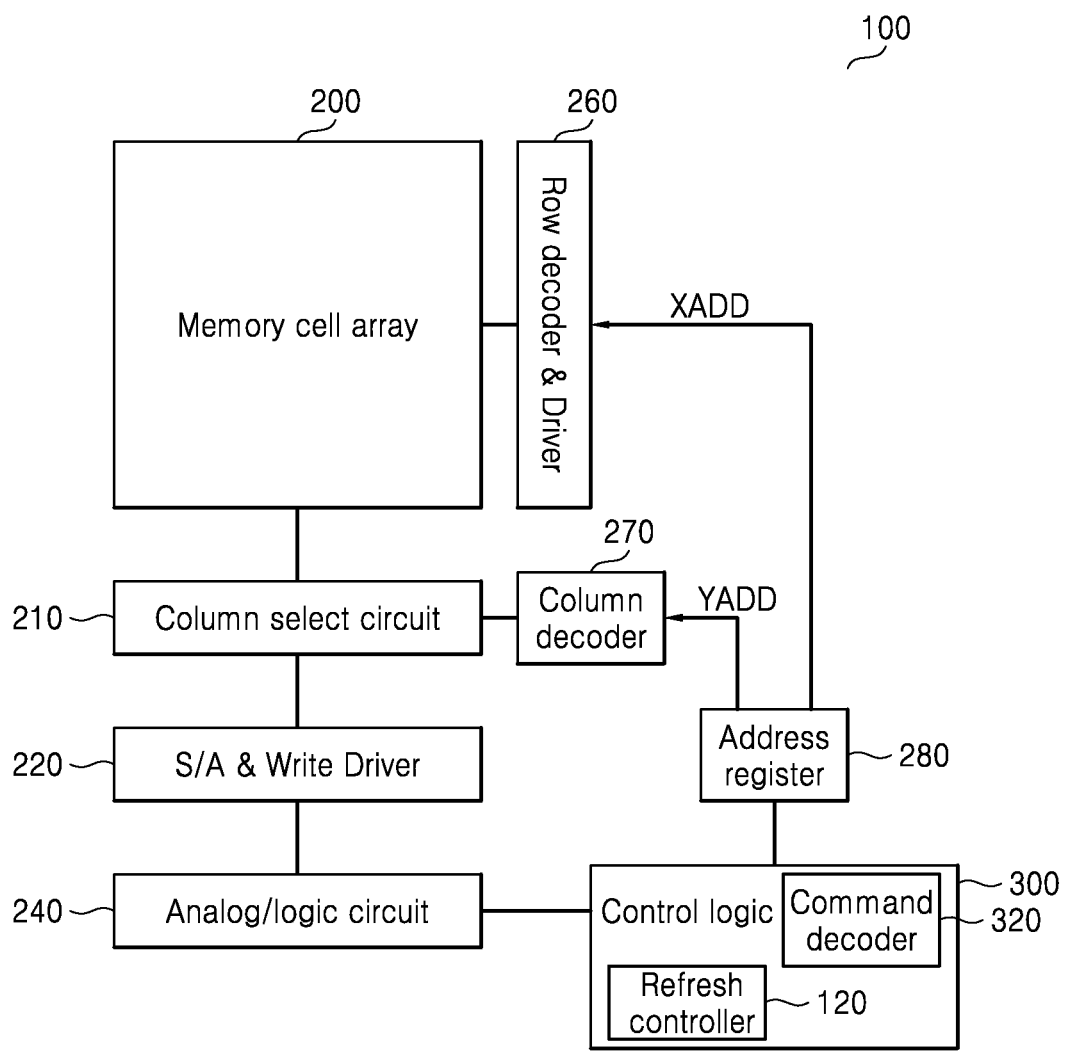
FIG. 1 is a block diagram of a semiconductor memory device according to some embodiments of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the size and relative sizes of layers and regions may be exaggerated for clarity. Like numbers refer to like dements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a semiconductor memory device 100 according to some embodiments of the inventive concept. Referring to FIG. 1, the semiconductor memory device 100 includes a memory cell array 200, a select circuit 210, a column decoder 270, a row decoder and driver 260, an address register 280, a write/read circuit 220, an analog/logic circuit 240, and a control logic 300. The semiconductor memory device 100 may be formed as a single semiconductor chip (e.g., as a monolithic integrated circuit).

The memory cell array 200 of the semiconductor memory device 100 may be formed as only one layer or may be formed as a plurality of layers of stacked memory cell sub-arrays (with memory cells arranged in three dimensions). The memory cell array 200 includes a plurality of bit lines, a plurality of word lines, and a plurality of memory cells. The memory cell array 200 may be divided into a Plurality of memory blocks. Each of the memory blocks may be divided into a plurality of memory pages, such as a contiguous set of memory pages, a contiguous set of word lines, and/or a contiguous set of addresses identifying corresponding memory pages and/or word lines, for example.

The memory cell array 200 also includes a plurality of (at least two) memory units that may determine whether to perform a refresh operation. Whether to perform a refresh operation is determined separately for each memory unit. The memory unit may be a memory block that may be formed by several consecutive rows of memory cells and/or formed by several consecutively addressed rows of memory cells, or a memory page (e.g., a row of memory cells, such as a word line) or may be a group of a plurality of memory blocks or memory pages. Memory blocks may be formed in memory banks, where the memory banks may be accessed (e.g., read, written to and/or refreshed) simultaneously.

The row decoder and driver 260 may decode a row address output from the address register 280 and select at least one of the word lines identified by the row address. The column decoder 270 may decode a column address output from the address register 280 and select at least one of the bit lines identified by the column address.

The write/read circuit 220 may write data to a memory cell and verify-read or read data from the memory cell.

The control logic 300 may include a refresh controller 120 and a command decoder 320. The refresh controller 120 may include a counter (not shown) to control a refresh operation to be carried out periodically. In some examples, the period of the refresh read may be determined by an externally input refresh command.

The analog/logic circuit 240 generates a write signal and a read signal. The analog/logic circuit 240 transmits the write signal and the read signal to the write/read circuit 220. The write signal and the read signal respectively determinate whether the write/read circuit 220 writes data to the memory cell or whether the write/read circuit 220 verify-reads or reads data from the memory cell. The analog/logic circuit 240 receives a refresh signal from the refresh controller 120, sets a reference read value, and transmits the reference read value included in the read signal to the write/read circuit 220. The refresh signal may include a default refresh signal and a weak cell refresh signal, which will be described later. The write/read circuit 220 may read data from a predetermined memory unit. The refresh controller 120 newly determines whether to refresh the memory unit based on the read data. A determination result is sent to the write/read circuit 220 and the memory unit is refreshed according to the determination result. The refresh of the memory unit may be carried out by reading data from the memory unit and rewriting the read data to the memory unit. At this time, a refresh read command and an address of the memory unit to be refreshed are transmitted to the column decoder 270 and the row decoder 260 via the address register 280.

Figure 2:
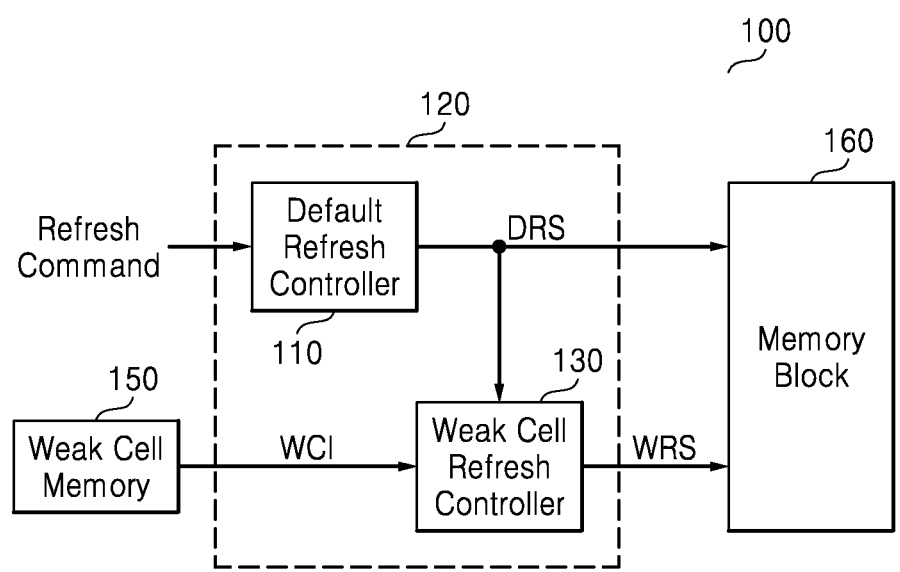
FIG. 2 is a schematic block diagram of the semiconductor memory device illustrated in FIG. 1, according to some embodiments of the inventive concept.

FIG. 2 is a schematic block diagram of the semiconductor memory device 100 illustrated in FIG. 1, according to some embodiments of the inventive concept. Referring to FIG. 2, the semiconductor memory device 100 may include a semiconductor memory, such as a dynamic random access memory (DRAM) having a refresh operation.

The semiconductor memory device 100 includes a default refresh controller 110, a weak cell refresh controller 130, a weak cell memory 150, and a memory block 160.

The default refresh controller 110 may receive a refresh command and generate a default refresh signal DRS according to the refresh command. The default refresh controller 110 may send the default refresh signal DRS to the memory block 160 and the weak cell refresh controller 130. The refresh command may be generated by a host (not shown) external to the semiconductor memory device 100. The refresh command may be generated by the external host when host determines the refresh of the memory block 160 is necessary. For example, the host may be a memory controller. For example, the memory controller may be formed as a separate integrated circuit (IC) chip from the memory device, which may be a memory semiconductor chip or a package of plural (e.g., stacked) memory semiconductor chips.

The refresh command may be periodically generated in accordance with a predetermined refresh interval or the refresh command may be generated at the request of a system (which may be at the request of the memory device 100) regardless of the predetermined refresh interval. The refresh interval is a time between the generation of a refresh command and the generation of a subsequent refresh command. N refresh commands may be generated until all of memory cells included in the memory block 160 are refreshed. The N refresh commands may be equally spaced in time within a block refresh period for the entire memory block 160. In this case, a result of multiplying the predetermined period by N may be the refresh period for the entire memory block 160.

The refresh period for the entire memory block 160 (which is be referred to herein as the block refresh period) may be determined based on a cell of the memory block 160 that has the least retention performance among a group of cells, e.g., the shortest retention time among a group of the memory cells included in the memory block 160 in order to prevent data stored in any of the memory cells from being lost. In other words, it may be determined that a refresh operation should be carried out before a cell having the least retention performance among the memory cells included in the memory block 160 loses data. The block refresh period that may control the timing of default refresh operations (e.g., based on the default refresh signal DRS described herein) may be determined based on the shortest retention time of a subset of all the memory cells of the memory block 160. The subset of memory cells of memory block 160 may be selected as those having longer retention times than those outside the subset. Memory cells outside of the subset of memory cells of the memory block 160 may have shorter retention times than the memory cell of the subset having the shortest retention time. For example, memory cells outside the subset may be selected as those having the shortest retention times of the memory block 160, therefore allowing a higher value for the shortest retention time of the subset of memory cells. Memory cells outside the subset of memory cells of the memory block 160 may be subject to additional and/or separate refresh operations outside the default refresh operations. For example, the retention time of all memory cells (or memory cell rows) may be tested during manufacturing. Those in the bottom X % (e.g., bottom 1%, bottom 5%, bottom 10%) of retention times (shortest retention times) may be determined to be subject to one or more additional refresh operations in addition to the default refresh operations scheduled during a block refresh period. The remaining memory cells (or memory cell rows) may be refreshed in accordance with the default refresh operations scheduled during a block refresh period. These remaining memory cells (or memory cell rows) may constitute the subset of memory cells, whose weakest cell (e.g., shortest retention time) may determine the block refresh period for default refresh operations. A row (e.g., word line) of memory cells may be determined to have a retention time equal to the retention time of its weakest (e.g., lowest retention time) memory cell.

The default refresh signal DRS may include a default refresh address signal DRA for indicating a memory unit to be refreshed among the memory cells included in the memory block 160 and a default refresh control signal RCS for determining Whether to enable a default refresh. The default refresh signal DRS may control the memory block 160 so that all of the memory cells included in the memory block 160 are refreshed during the block refresh period.

The default refresh signal DRS may also provide the weak cell refresh controller 130 with a basis for the generation of a weak cell refresh signal WRS with respect to a weak cell. The structure and the operation of the default refresh controller 110 will be described in detail with reference to FIGS. 2 and 6 later.

The weak cell refresh controller 130 may receive the default refresh signal DRS from the default refresh controller 110 and weak cell information WCI from the weak cell memory 150 and generate and send the weak cell refresh signal WRS to the memory block 160. A weak cell is a cell that has less retention performance than a normal cell and may refer to a cell that has a data retention time shorter than the block refresh period.

If the weak cell has the data retention time shorter than the block refresh period, it may lose data before it is refreshed by the default refresh controller 110. Accordingly, the weak cell refresh controller 130 may control the memory block 160 to perform at least one extra refresh on the weak cell in addition to a refresh controlled by the default refresh controller 110 during the block refresh period. The weak cell refresh controller 130 may control the memory block 160 so that a weak refresh period of a weak cell is carried out is shorter than the block refresh period. The weak cell refresh period may be equal to, longer than or shorter than half of the block refresh period.

The weak cell refresh signal WRS may include a weak cell refresh address signal WRA for indicating a weak cell to be refreshed among the memory cells included in the memory block 160 and a weak cell refresh control signal (which may be a weak cell enable signal WRS_EN) for determining whether to enable a weak cell refresh. The weak cell refresh signal WRS may control the memory block 160 to perform at least one refresh on the weak cell apart from a default refresh, such as a refresh responsive to or controlled by the default refresh controller 110 during the block refresh period.

Exemplary structure and the operation of the weak cell refresh controller 130 will be described in detail with reference to FIGS. 3 and 7 later.

The weak cell memory 150 may store the weak cell information WCI, e.g., addresses identifying a weak cell having a data retention time shorter than the block refresh period among the memory cells included in the memory block 160. Each address identifying the weak cell may be an address that identifies a group of memory cells, such as a row address. When the address identifies a group of memory cells along with the weak cell, sonic of the memory cells may not be weak memory cells. Taking row addresses as an example, a row weak cell of a row of a memory those connected to a particular word line) may cause the entire row to be considered a weak cell row, even when other memory cells of this cell row are normal and have a data retention time longer than the block refresh period). The weak cell memory 150 may transmit the weak cell information WCI to the weak cell refresh controller 130 at the request of the weak cell refresh controller 130.

A weak cell test circuit (not shown) may distinguish weak cells from normal cells (which have a data retention time longer than the block refresh period) in the memory cells included in the memory block 160 and send address information of the weak cells to the weak cell memory 150. For instance, the weak cell test circuit may uniformly write a logic value of 1 to the memory cells included in the memory block 160 and read a logic value from the memory cells at a time shorter than the block refresh period elapses. At this time, when a logic value of 0 is read from a cell, the cell may be determined to be a weak cell and address information of the weak cell may be sent to or programmed into the weak cell memory 150. The weak cell test circuit may be part of testing equipment used to test the memory device during manufacture of the memory device. For example, the weak cell test circuit may be used to test a memory chip prior to packaging the memory device. Alternatively, the weak cell test circuit may be a test circuit formed integrally with the memory device (e.g., on-chip with a memory chip) or may be part of control circuitry of a memory controller, allowing identification of weak cells after manufacturing, which may take into account stresses later incurred by the memory device and/or operating conditions (e.g., such as temperature) when identifying weak cells.

The weak cell memory 150 may be implemented by a non-volatile memory that retains data regardless of power supply and may use physical fuse-cutting using a laser or electronic programming for data storing. The weak cell memory 150 may be electrically erasable programmable read-only memory (EEPROM), flash memory, magnetic random access memory (MRAM), conductive bridging RAM (CBRAM), ferroelectric RAM (FeRAM), phase-change RAM (PRAM), or resistive RAM (RRAM or ReRAM), which can retain information regardless of power supply.

The weak cell memory 150 may be provided within the semiconductor memory device 100 as shown in FIG. 2 (e.g., as part of a semiconductor chip that forms the semiconductor memory device 100), but the inventive concept is not restricted to the current embodiments. The weak cell memory 150 may be provided outside the semiconductor memory device 100. For instance, the weak cell memory 150 may be included with or part of a memory controller, a central processing unit (CPU), a program, or a memory device (a nonvolatile memory device or a hard disk) positioned outside the semiconductor memory device 100.

The memory block 160 may receive the default refresh signal DRS including a default refresh control signal RCS and a default refresh address signal DRA from the default refresh controller 110 and refresh a plurality of cells corresponding to the default refresh address signal in response to activation, of the default refresh control signal RCS.

The memory block 160 may also receive the weak cell refresh signal WRS including a weak cell refresh control signal WRS_EN and a weak cell refresh address signal WRA from the weak cell refresh controller 130 and refresh a plurality of weak cells corresponding to the weak cell refresh address signal in response to activation of the weak cell refresh control signal. The memory block 160 may additionally perform at least one refresh on the weak cells during the block refresh period apart from a refresh controlled by the default refresh controller 110.

When the default refresh control signal RCS received from the default refresh controller 110 or the weak cell refresh control signal received from the weak cell refresh controller 130 is activated, the memory block 160 may ignore other commands that may be received until the refresh operation has been performed. Thus, a command signal, an address signal, and a data signal received from an external source, such as from a host or memory controller may be ignored and/or stored in an internal buffer for later processing. The cells identified by the default refresh address signal or the weak cell refresh address signal (as appropriate to whether the memory block 160 received the default refresh signal DRS or weak cell refresh signal WRS) may be activated and refreshed. The memory cells identified by a default refresh address and weak cell refresh address may be a cells of at least one word line (e.g., the default refresh address and weak cell refresh address may be row addresses, each row address may uniquely identify a word line), but the inventive concept is not restricted thereto. For example, the default refresh addresses and weak cell refresh addresses may identify a group of word lines to be refreshed. Activating and refreshing memory cells in the memory block 160 are techniques well known to those of ordinary skill in the art. Thus, detailed descriptions thereof will be omitted.

When the default refresh control signal RCS received from the default refresh controller 110 or the weak cell refresh control signal received from the weak cell refresh controller 130 is not asserted (e.g., deactivated), the memory block 160 may not perform a refresh operation but perform data read and write according to the command signal, the address signal, and the data signal received from the host. The data read and write of the memory block 160 is well known to those of ordinary skill in the art. Thus, detailed descriptions thereof will be omitted.

The memory block 160 is a usual memory circuit included in the semiconductor memory device 100 and may include a memory cell array (not shown) including a plurality of memory cells, a row decoder (not shown), a column decoder (not shown), and a sense amplifier (not shown). For example, the memory block 160 may comprise the memory cell array 200, the select circuit 210, the column decoder 270, the row decoder and driver 260, the address register 280 and the write/read circuit 220 of FIG. 1. These elements of the memory block 160 may be typical structures, and therefore, the details of these structures and the operations thereof are well known to those of ordinary skill in the art. Thus, detailed descriptions thereof will be omitted.

According to the current embodiments, the semiconductor memory device 100 performs at least one refresh on weak cells having the data retention time shorter than the block refresh period in addition to a normal refresh, thereby preventing data loss.

Figure 3:
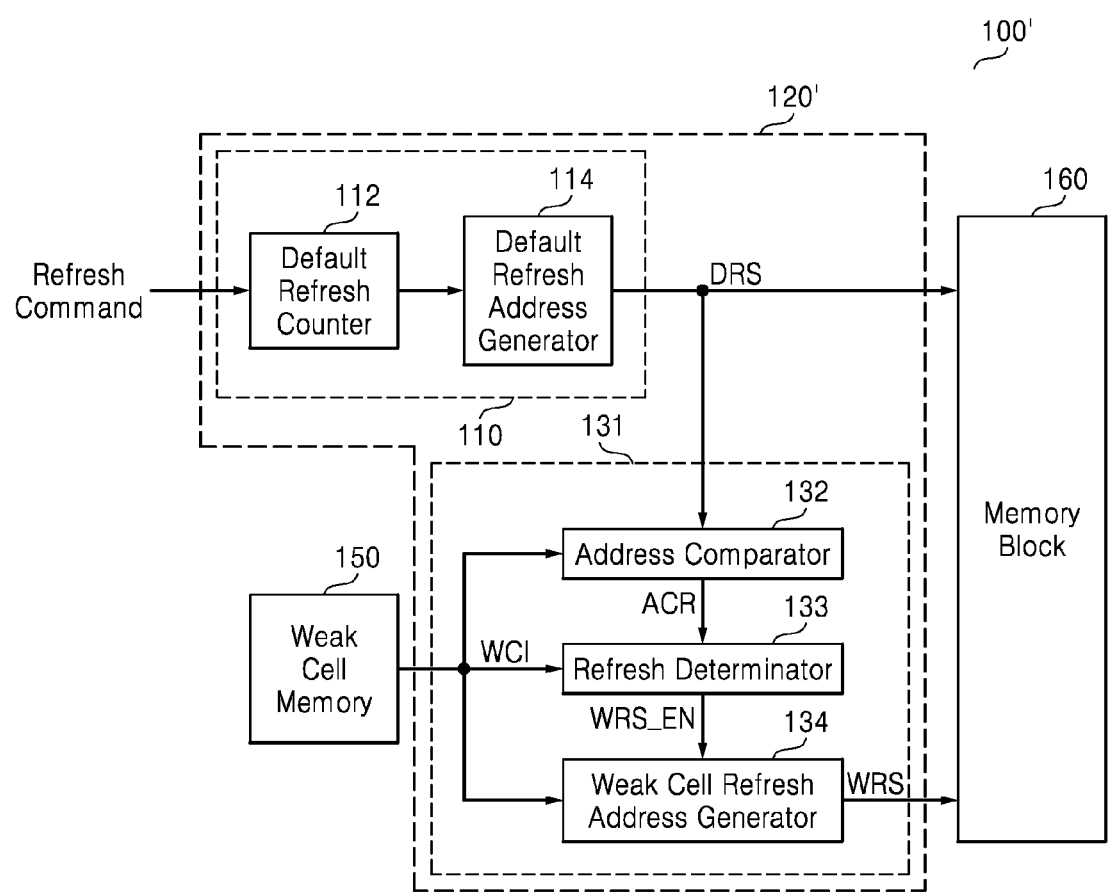
FIG. 3 is a detailed block diagram of a semiconductor memory device according to some embodiments of the inventive concept.

FIG. 3 is a detailed block diagram of a semiconductor memory device 100' according to some embodiments of the inventive concept. Referring to FIG. 3, the semiconductor memory device 100' includes the default refresh controller 110, a weak cell refresh controller 131, the weak cell memory 150, and the memory block 160. The semiconductor memory device 100' illustrated in FIG. 3 is an example of the semiconductor memory device 100 illustrated in FIG. 2, and therefore, redundant descriptions will be omitted.

FIG. 3 shows exemplary details of default refresh controller 110 illustrated in FIG. 2. The default refresh controller 110 may receive a refresh command and generate the default refresh signal DRS according to the refresh command. The refresh command may be received from a source external to the semiconductor memory device 100', such as from a host device or memory controller. The default refresh controller 110 may send the default refresh signal DRS to the memory block 160 and the weak cell refresh controller 131.

The default refresh controller 110 may include a default refresh counter 112 and a default refresh address generator 114. The default refresh counter 112 may send a count value, which varies with the refresh command, to the default refresh address generator 114 so that a refresh operation can be performed on all of memory cells included in the memory block 160.

The default refresh address generator 114 may receive the count value from the default refresh counter 112 and generate the default refresh signal DRS for the memory cells included in the memory block 160. The default refresh address generator 114 may generate the default refresh signal DRS so that all of the memory cells can be refreshed.

The default refresh address generator 114 may determine a timing and a refresh sequence of memory cells to be refreshed. In addition, the default refresh address generator 114 may detect that all of the memory cells included in the memory block 160 have been refreshed after receipt of a certain number of counts (or changes in the count) have been received from default refresh counter 112, or when the count value reaches a predetermined value and may stop the generation of the default refresh signal DRS.

The default refresh signal DRS may include a default refresh control signal RCS to activate a default refresh. The default refresh signal DRS may also include a default refresh address signal DRA. The default refresh address signal may identify the cells in memory block 160 to be upon receipt of an active default refresh control signal RCS. The default refresh address generator 114 may generate a refresh address sequence different from a write or read address sequence.

The cells refreshed in response to an active default refresh control signal RCS may comprise a word line, or several word lines (e.g., with consecutive word line or row addresses). However, the inventive concept is not restricted thereto. The default refresh signal DRS may be transmitted to the weak cell refresh controller 131 and the memory block 160.

The weak cell refresh controller 131 illustrated in FIG. 3 shows exemplary detail of the weak cell refresh controller 130 illustrated in FIG. 2. The weak cell refresh controller 131 may include an address comparator 132, a refresh determinator 133, and a weak cell refresh address generator 134. The address comparator 132 may receive the default refresh signal DRS from the default refresh controller 110 and the weak cell information WCI from the weak cell memory 150. The address comparator 132 may compare the default refresh address signal DRA included in the default refresh signal DRS with the weak cell information WCI and generate an address comparison result ACR. In response to the comparison of the default refresh address signal DRA with the weak cell information WCI, address comparator 132 may generate the address comparison result ACR at a logic high when refresh of weak cells is determined to be desired and may generate the address comparison result ACR at a logic low when the refresh of weak cells is determined to be unnecessary.

The refresh determinator 133 may receive the address comparison result ACR and the weak cell information WCI and control the operation timing of the weak cell refresh address generator 134. For instance, when the address comparison result ACR for a particular weak cell identified by the weak cell information WCI is at the logic high, the refresh determinator 133 may delay a weak cell refresh enable signal WRS_EN for the weak cell by a predetermined period of time with reference to delay information contained as part of the weak cell information WCI.

When a weak cell refresh controlled by the weak cell refresh controller 131 is carried out simultaneously with a default refresh, noise in a sense amplifier (not shown) included in the memory block 160 may be too great for the refresh to be performed normally. Accordingly, the refresh determinator 133 may control the timing of generation of the weak cell refresh enable signal WRS_EN to disperse the noise.

The weak cell refresh address generator 134 may receive the weak cell refresh enable signal WRS_EN and the weak cell information WCI and generate the weak cell refresh signal WRS. In other words, the weak cell refresh address generator 134 may control the memory block 160 so that a current weak cell can be refreshed at least one time in addition to a default refresh during the block refresh period.

The weak cell refresh address generator 134 may control the memory block 160 so that a weak cell refresh period in which the current weak cell is refreshed is the same as, shorter than or longer than half of the block refresh period. The operations of the weak cell memory 150 and the memory block 160 are the same as those illustrated in FIG. 2. Thus, descriptions thereof will be omitted.

Figure 4:
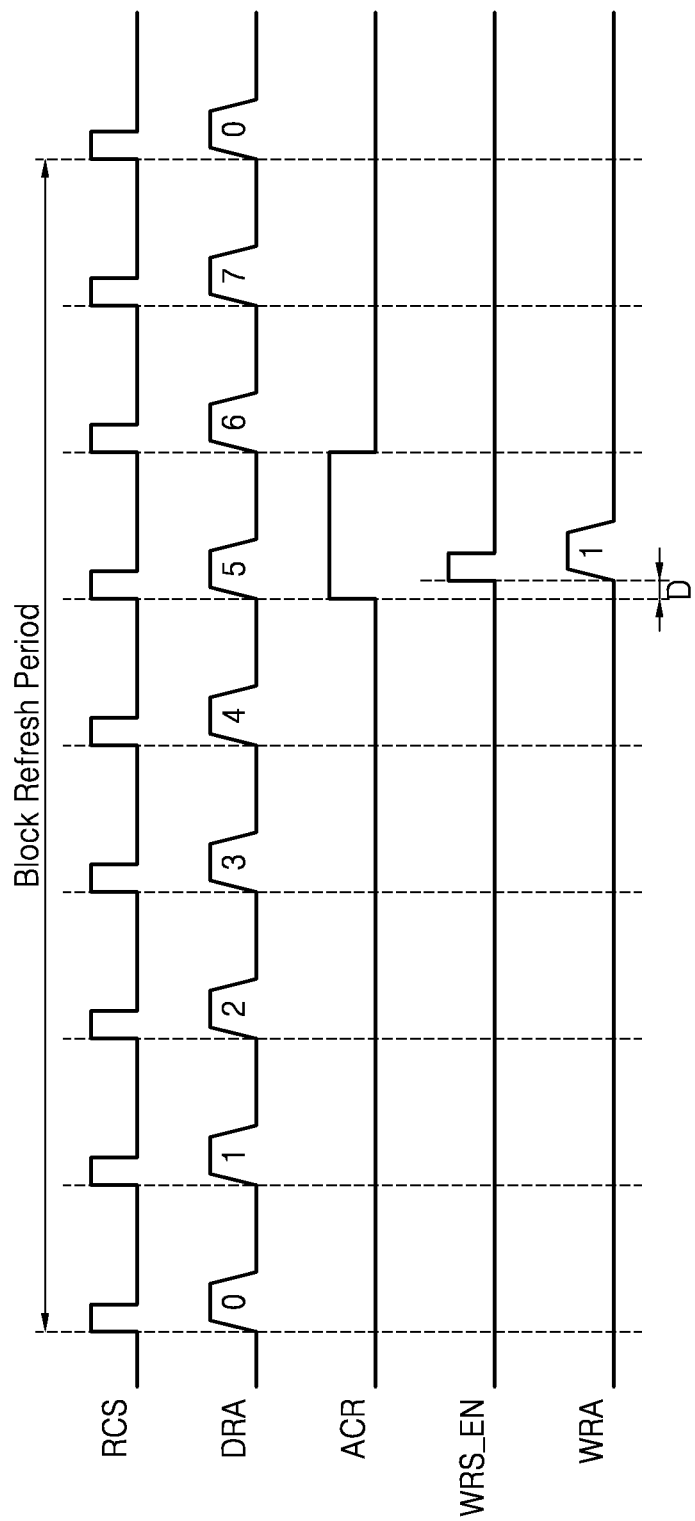
FIG. 4 is an exemplary timing chart showing an operation of the semiconductor memory device illustrated in FIG. 3.

FIG. 4 is a timing chart showing the operation of the semiconductor memory device 100' illustrated in FIG. 3. FIG. 5 is a table for explaining in detail the operation of the semiconductor memory device 100' illustrated in FIG. 3.

Referring to FIGS. 3 through 5, for ease of description, it is assumed that a memory cell array (e.g., memory cell array 200 of FIG. 1) included in the memory block 160 of the semiconductor memory device 100' illustrated in FIG. 3 includes a total of eight (8) rows and a single block refresh period is completed with a total of eight (8) default refresh operations. A illustrated in FIG. 4, eight (8) refresh commands may be generated during the block refresh period. The default refresh controller 110 may receive the refresh commands and generate a default refresh control signal RCS and a default refresh address signal DRA for each of row addresses, the row addresses being generated sequentially from a row address DRA of "0" to a row address DRA of "7". The memory block 160 may perform a refresh on a plurality of memory cells at a row address of the memory cell array, which corresponds to each of sequentially generated default refresh address signals DRA "0" to "7" (e.g., a word line of memory cells for each row address DRA).

In this simplified example, each row address may be represented by three bits RA0, RA1 and RA2. The table illustrated in FIG. 5 shows the relationship between bits RA0 through RA2 at a row address and the row address expressed in decimal form. In other words, each of the bits RA0 through RA2 represents a digit in the row address expressed in binary form. The bit RA0 represents the lowest digit (e.g., least significant bit) and the bit RA2 represents the highest digit (most significant bit) of a row address.

Row addresses identifying weak cell rows may be stored in the weak cell memory 150. For example, weak cell rows may be identified during testing as part of manufacturing, and weak cells may be programmed into weak cell row memory 150 (e.g., by blowing fuses of a each of plural sets of fuses, each fuse set identifying a weak cell row). Alternatively, the memory device 100 may perform self tests after manufacturing to automatically identify weak cell rows and store information identifying the weak cell rows in weak cell row memory 150. When a weak cell corresponds to the row address of "1", weak cell information WCI corresponding to the row address of "1" may be stored by the weak cell test circuit in the weak cell memory 150.

The address comparator 132 included in the weak cell refresh controller 131 may compare the default refresh address signal DRA received from the default refresh controller 110 with the weak cell information WCI received from the weak cell memory 150 and determine whether the bits RA1 and RA0 other than the bit RA2 (RA2 having the longest period during the block refresh period) are the same between the default refresh address signal DRA and the weak cell information WCI. In detail, as the default refresh address signal DRA is sequentially increased during the default refresh operations during the block refresh period, the value of the bit RA2 changes at intervals of 4 rows while the values of the respective bits RA1 and RA0 change at intervals of 2 rows and 1 row, respectively. Accordingly, the bit RA2 has the longest period and may be used to determine a timing of an extra refresh operation for a weak cell row. In this case, the weak cell row has been previously determined as cell row having a row address of "1", During default refresh operations, cell rows "0" to "7" are refreshed sequentially in order, as shown in FIG. 4. As part of the default refresh operations, cell row "1" is refreshed as the next cell row after cell row having address "0". During the default refresh operations, the address comparator 132 may compare the weak cell information WCI with default refresh address signals DRA (here, compare weak cell information WCI with each of default refresh address signals DRA as they are generated by default refresh address generator 114). When all bits but the most significant bit (MSB) A2 of the default refresh address and the address of the weak cell row match, the address comparator 132 may generate the address comparison result ACR at a logic high. Refresh determinator 133 may generate a weak cell refresh enable signal WRS_EN at a desired timing (e.g., with a delay to avoid conflict with the default refresh operation or to avoid, undesired noise due to the weak cell refresh and default refresh operations being too close in time). Weak cell refresh address generator 134 receives the weak cell refresh enable signal WRS_EN and generates the weak cell refresh signal WRS (which may comprise the weak cell row address identified by the weak cell information WCI and the weak cell refresh enable signal WRS_EN) to cause a refresh operation of the weak cell row identified by the weak cell information WCI (in this example, weak cell row "1"). Thus, weak cell row "1" may be refreshed twice every block refresh period (with a default refresh operation and a weak cell refresh operation) whereas normal cell rows may be refreshed just once per every block refresh period (with a default refresh operation). As will be appreciated, in this instance (during generation of default refresh address signal DRA"5"), the default refresh address DRA ("5") and the weak cell row address ("1") do not match, differing in their most significant bit. In this example, the weak cell information WCI may store the weak cell row addresses and the comparator may invert one of the MSB (here RA2) bit of the default refresh address DRA or the weak cell row address. As another example, the weak cell information WCI may store an inverted MSB bit which may be later inverted when being provided to generate the weak cell refresh address of the weak cell refresh signal WRS.

In an alternative embodiment, only certain bits of the default refresh address DRA and the weak cell row address identified by the weak cell row information WCI are compared, and if a match is detected, a corresponding weak cell refresh signal WRS is generated (e.g., in the manner described above). For example, MSB bit RA2 of the default refresh address signal DRA and the weak cell row address identified by weak cell information WCI may not be compared as part of the comparison performed by address comparator 132. A weak cell refresh signal WRS is generated if bits RA1 and RA0 of the default refresh address DRA match bits RA1 and RA0 of the weak cell row address identified by weak cell information WCI; when any one of the bits RA1 and RA0 is different, no weak cell refresh signal WRS is generated as a result of the comparison result by address comparator 132. In this example, when receiving a default refresh address signal DRA corresponding to either the row address of "1" or the row address of "5", the address comparator 132 may compare the weak cell information WCI with the default refresh address signal DRA corresponding to the row address of "5" and output the address comparison result ACR at the logic high since both of the bits RA1 and RA0 are the same therebetween. In this example, the weak cell refresh controller 131 may generate two weak cell refresh signals WRS to refresh weak cell row "1" every block refresh period.

The invention is not limited to doubling the number of refresh operations of a weak cell in a block refresh period. For example, in an alternative example, four weak cell refresh operations per block refresh period may be implemented for some of the weak cell rows by performing a comparison of the bits of default refresh address signal DRA with the weak cell row address identified by weak cell information WCI except the two most significant bits. In the example of FIG. 5, as RA2 and RA1 are the two most significant bits, only RA0 bits of the default refresh address signal DRA and the weak cell row address would be compared, resulting in four refresh operations per block refresh period (every time RA0 is "0" or every time RA0 is "138 —depending on the RA0 bit of the weak cell row address). Other examples may include additional refresh operations over block refresh periods that result a number of refresh operations other than a factor of 2 per block refresh period. For example, in the example of FIG. 5, if cell row having an address of "0" (binary "000") has been identified as a weak cell row, additional refresh operations may be added when the default refresh address signal DRA output by default refresh address generator 114 (as part of the default refresh signal DRS) is "2" (binary "010") and later when the default refresh address signal DRA is "5" (binary "101"). In this latter example, the address comparator 132 may perform comparisons of the default refresh address signal DRA with an address equaling a mathematically modified weak cell row address to determine a match. For example, the default refresh address signal DRA may be compared to each of two address values, the two address values respectively equaling a binary addition (rounded if needed) of ⅓ and ⅔ of the maximum address of the cell row addresses with the weak cell row address identified by the weak cell information WCI, with any resultant sum that exceeds the maximum cell row address being converted to the excess amount.

It should be emphasized that the example of FIG. 5 is simplified. It is expected that many more than eight (8) rows of memory may exist in the memory block 160. In such a case, the address identifying the rows of memory may contain more than three (3) address bits (e.g., may contain at least 18 or at least 21 address bits). The weak cell memory 150 may be configured to store a plurality of identified weak cell row addresses, each of which may be compared to the default refresh address signal by address comparator 132, with any match resulting in an active address comparison result ACR by address comparator 132. In addition, each of the weak cell addresses stored by weak cell memory 150 need not have the same increase in refresh operations per block refresh period. For example, some of the weak cell row addresses may have one additional (total two) refresh operation per block refresh period, others may have two additional (total three) and other may have three additional (total four) refresh operations per block refresh period. One or more flag bits associated with the weak cell row address that may be stored in the weak cell memory 150 may indicate how many refresh operations should be performed per block refresh period in addition to the default refresh operation.

In the example of FIG. 5, eight default refresh operations are shown to be evenly distributed over a block refresh period. When more than eight default refresh operations are performed, they may be evenly distributed over the block refresh period such that the refresh operations are scheduled to occur at regular intervals. Each refresh operation may refresh a single row or may refresh plural rows. For example, a refresh command may indicate that all banks refresh their row A (e.g., an eight bank memory block 160 would refresh eight rows, row A in each of eight banks). The refresh operations of different banks may be performed in parallel, although not necessarily starting and ending simultaneously. Each of the regularly scheduled refresh operations may also include a plurality of sequential refresh operations (e.g., a plurality of burst refresh operations, the plurality of burst refresh operations regularly spaced across the block refresh period). For example, each refresh operation represented by FIG. 5 (i.e., each refresh operation indicated by DRA "0" to "7") may instead be a plurality of refresh operations. For example, DRA "0" may instruct the semiconductor device to perform sequential refresh operations for rows "01" to "09," refresh operation "1" may instruct the semiconductor device 100 to perform sequential refresh operations for rows "11" to "19," etc.

A method of comparing default refresh address signals with the weak cell information WCI is not restricted to the above-described examples and may be changed by those of ordinary skill.

The refresh determinator 133 may receive the address comparison result ACR and the weak cell information WCI and control the operation timing of the weak cell refresh address generator 134. In detail, the refresh determinator 133 may output the weak cell refresh enable signal WRS_EN a predetermined delay D after receiving the address comparison result ACR and the weak cell information WCI instead of immediately outputting the weak cell refresh enable signal WRS_EN.

The weak cell refresh address generator 134 may receive the weak cell refresh enable signal WRS_EN and the weak cell information WCI and generate the weak cell refresh signal WRS for the row address of "1". In other words, the memory block 160 may nearly simultaneously perform a refresh of the row address of "5" (in response to the default refresh signal DRS) and a refresh of the row address of "1" (in response to the weak cell refresh signal WRS). According to the current embodiments, default refresh address signals are compared with the weak cell information WCI, so that in addition to a normal refresh, at least one more refresh is performed on a weak cell having a data retention time shorter than a refresh period. As a result, data loss is prevented.

Figure 6:
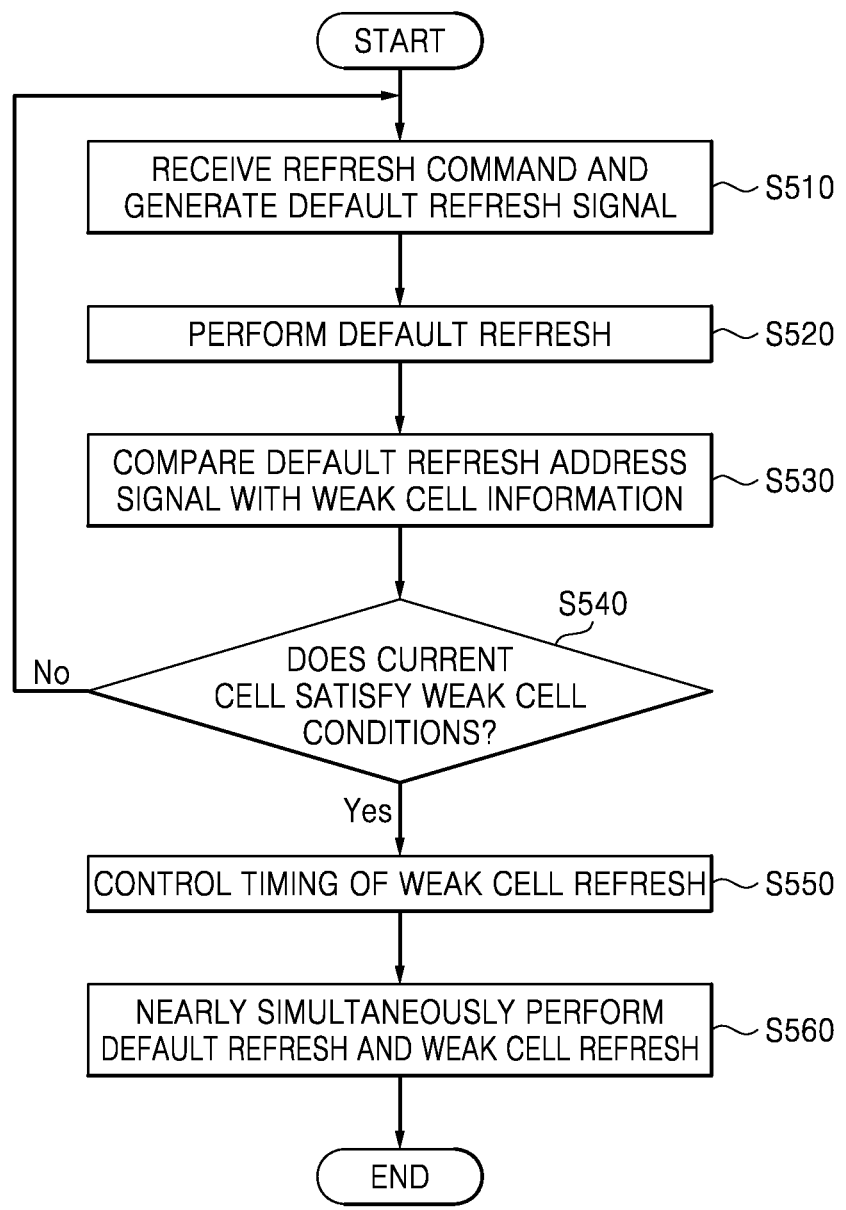
FIG. 6 is a flowchart of a method of refreshing memory cells according to some embodiments of the inventive concept.

FIG. 6 is a flowchart of the operations of the semiconductor memory device 100' according to some embodiments of the inventive concept. Referring to FIGS. 3 through 6, the default refresh controller 110 may receive a refresh command and generate the default refresh signal DRS according to the refresh command in operation S510. The default refresh controller 110 may send the default refresh signal DRS to the memory block 160 and the weak cell refresh controller 131.

The memory block 160 may receive the default refresh signal DRS including a default refresh control signal RCS and a default refresh address signal DRA from the default refresh controller 110 and refresh a plurality of memory cells corresponding to the default refresh address signal in response to the activation of the default refresh control signal RCS in operation S520.

The address comparator 132 included in the weak cell refresh controller 131 may receive the default refresh signal DRS from the default refresh controller 110 and the weak cell information WCI from the weak cell memory 150. The address comparator 132 may compare the default refresh address signal DRA included in the default refresh signal DRS with the weak cell information WCI and generate the address comparison result ACR in operation S530. The address comparator 132 may generate the address comparison result ACR at the logic high when a refresh of a weak cell is determined, necessary as the result of comparing the default refresh address signal with the weak cell information WCI and may generate the address comparison result ACR at a logic low when the refresh of the weak cell is determined unnecessary. The inventive concept is not restricted thereto.

When the refresh of the weak cell is determined unnecessary, for instance, when at least one of the bits RA1 and RA0 other than the bit RA2 having the longest period is not the same between the default refresh address signal and the weak cell information WCI as shown in FIG. 5, in operation S540, the refresh of the weak cell may not be carried out and just a default refresh may be performed (the route of "NO" from operation S540).

When the refresh of the weak cell is determined necessary, for instance, when both of the bits RA1 and RA0 other than the bit RA2 having the longest period are the same between the default refresh address signal and the weak cell information WCI as shown in FIG. 5, in operation S540, the refresh determinator 133 and the weak cell refresh address generator 134 may operate (the route of "YES" from operation S540).

The refresh determinator 133 included in the weak cell refresh controller 131 may receive the address comparison result ACR and the weak cell information WCI and control the operation timing of the weak cell refresh address generator 134 in operation S550. For instance, when the address comparison result ACR for a current weak cell is at the logic high, the refresh determinator 133 may generate the weak cell refresh enable signal WRS_EN for the current weak cell with reference to the weak cell information WCI.

The weak cell refresh address generator 134 included in the weak cell refresh controller 131 may receive the weak cell refresh enable signal WRS_EN and the weak cell information WCI and generate the weak cell refresh signal WRS in operation S560. In other cell information WCI, the weak cell refresh address generator 134 may control the memory block 160 to perform at least one more refresh on the weak cell in addition to a default refresh during the refresh period.

A refresh by the default refresh controller 110 and a refresh by the weak cell refresh controller 131 may be performed nearly simultaneously (e.g., performed with the minimum delay time between refresh cycle times) or may be performed with a time difference to disperse noise, such as in the sense amplifier, of the memory block 160.

Figure 7:
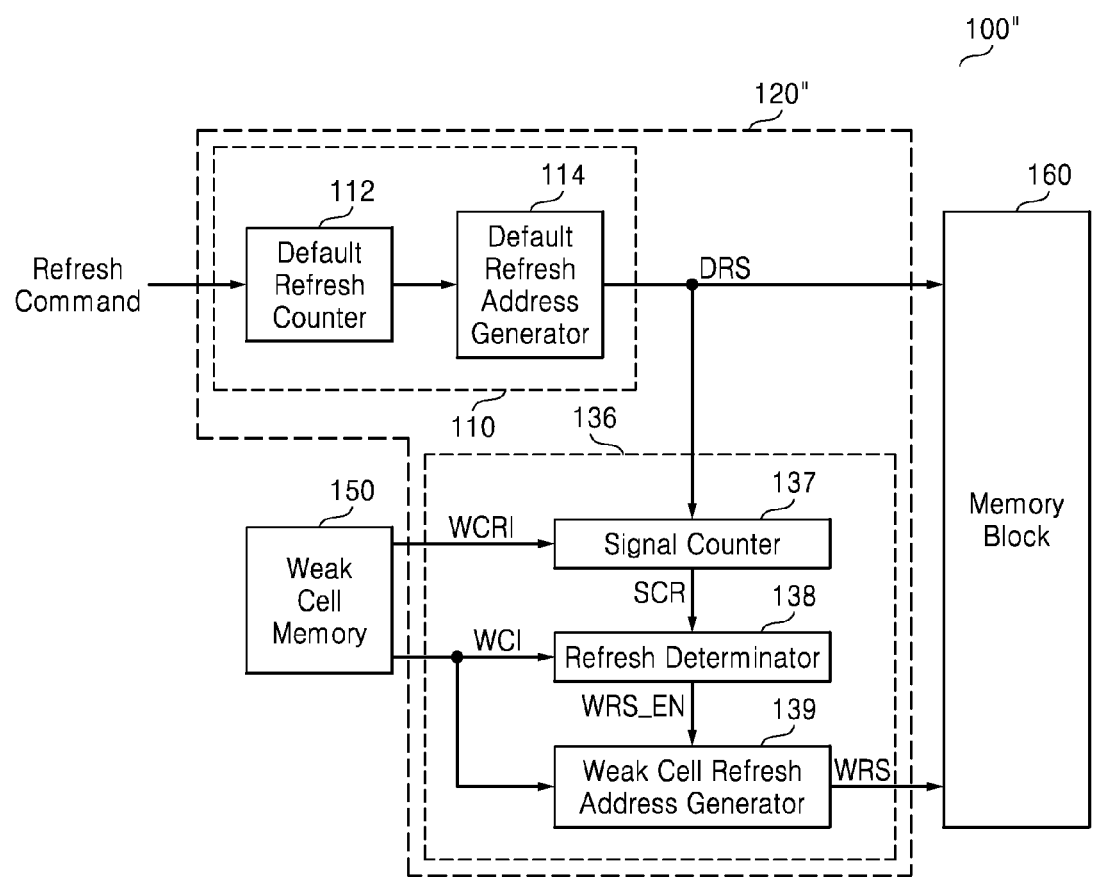
FIG. 7 is a detailed block diagram of a semiconductor memory device according to other embodiments of the inventive concept.

FIG. 7 a detailed block diagram of a semiconductor memory device 100" according to other embodiments of the inventive concept. Referring to FIG. 7, the semiconductor memory device 100" includes the default refresh controller 110, a weak cell refresh controller 136, the weak cell memory 150, and the memory block 160. The semiconductor memory device 100" illustrated in FIG. 7 is another example of the semiconductor memory device 100 illustrated in FIG. 2 and performs the same operations as the semiconductor memory device 100 illustrated in FIG. 3 except for some operations. Thus, redundant descriptions will be omitted.

The weak cell refresh controller 136 illustrated in FIG. 7 shows in detail the weak cell refresh controller 130 illustrated in FIG. 2. The weak cell refresh controller 136 may include a signal counter 137, a refresh determinator 138, and a weak cell refresh address generator 139.

The signal counter 137 may receive the default refresh signal DRS from the default refresh controller 110 and weak cell refresh information WCRI that will be described later. The signal counter 137 may count the number of receptions of the default refresh signal DRS and generate a count result. The signal counter 137 may compare the number of receptions of the default refresh signal DRS with the weak cell refresh information WCRI and generate a signal counting result SCR. In detail, the signal counter 137 may output the signal counting result SCR whose logic value changes depending on whether the number of receptions of the default refresh signal DRS is the same as a value greater than the weak cell refresh information WCRI by a predetermined value.

The signal counting result SCR may be at a logic high when the number of receptions of default refresh address signals reaches a predetermined value or when the count result is greater than the weak cell refresh information WCRI by a predetermined value, so that a weak cell refresh is carried Out a predetermined time D after a default refresh of a current weak cell is performed. Contrarily, the signal counting result SCR may be at a logic low when the number of receptions of default refresh address signals does not reach the predetermined value. The inventive concept is not restricted to these exemplary details.

The signal counter 137 counts the default refresh signal DRS received from the default refresh controller 110 in the embodiments illustrated in FIG. 7. However, the refresh command may be counted in other embodiments. In other embodiments, the signal counter 137 may count the output of a clock (not shown). The clock may be internal or external to the semiconductor device. The count may be reset every block refresh period. Thus, the count of the clock may be used to determine one or more periods of time after the default refresh operation of the weak cell row to perform respective one or more additional refresh operations for the weak cell row. Default refresh operations need not be evenly distributed over the block refresh period. For example, all default refresh operations may be performed as a single burst refresh at the beginning of the block refresh period.

The refresh determinator 138 may receive the signal counting result SCR and the weak cell information WCI and control the operation timing of the weak cell refresh address generator 139. For instance, when the signal counting result SCR is at a logic high, the refresh determinator 138 may sequentially generate weak cell refresh enable signals WRS_EN respectively for a plurality of weak cells with reference to the weak cell information WCI. For example, weak cell memory 150 may include a table associating each of a plurality of signal counting results with one or more weak cell row addresses. For each signal counting result, the table may be accessed to determine if any weak cell row addresses have been associated with the signal counting result, and if so, to sequentially perform additional refresh operations for the associated weak cell rows. In addition, the refresh determinator 138 may generate a weak cell refresh enable signal WRS_EN with a predetermined delay of D to reduce noise in the sense amplifier of the memory block 160.

The weak cell refresh address generator 139 may receive the weak cell refresh enable signal WRS_EN and the weak cell information WCI and generate the weak cell refresh signal WRS. In other words, the weak cell refresh address generator 139 may control the memory block 160 to perform at least one more refresh on the current weak cell in addition to a default refresh during the refresh period. The weak cell refresh address generator 139 may control the memory block 160 so that a weak cell refresh period in which the current weak cell is refreshed is shorter than the refresh period and longer than half of the refresh period or shorter than half of the refresh period. The weak cell memory 150 may store the weak cell refresh information WCRI about a place of each weak cell in a default refresh sequence together with the weak cell information WCI. The weak cell refresh information WCRI may be received from the default refresh address generator 114 that decides the refresh sequence of memory cells.

The operations of the default refresh controller 110, the weak cell memory 150, and the memory block 160 are the same as those described with reference to FIG. 2. Thus, descriptions thereof will be omitted.

Figure 8:
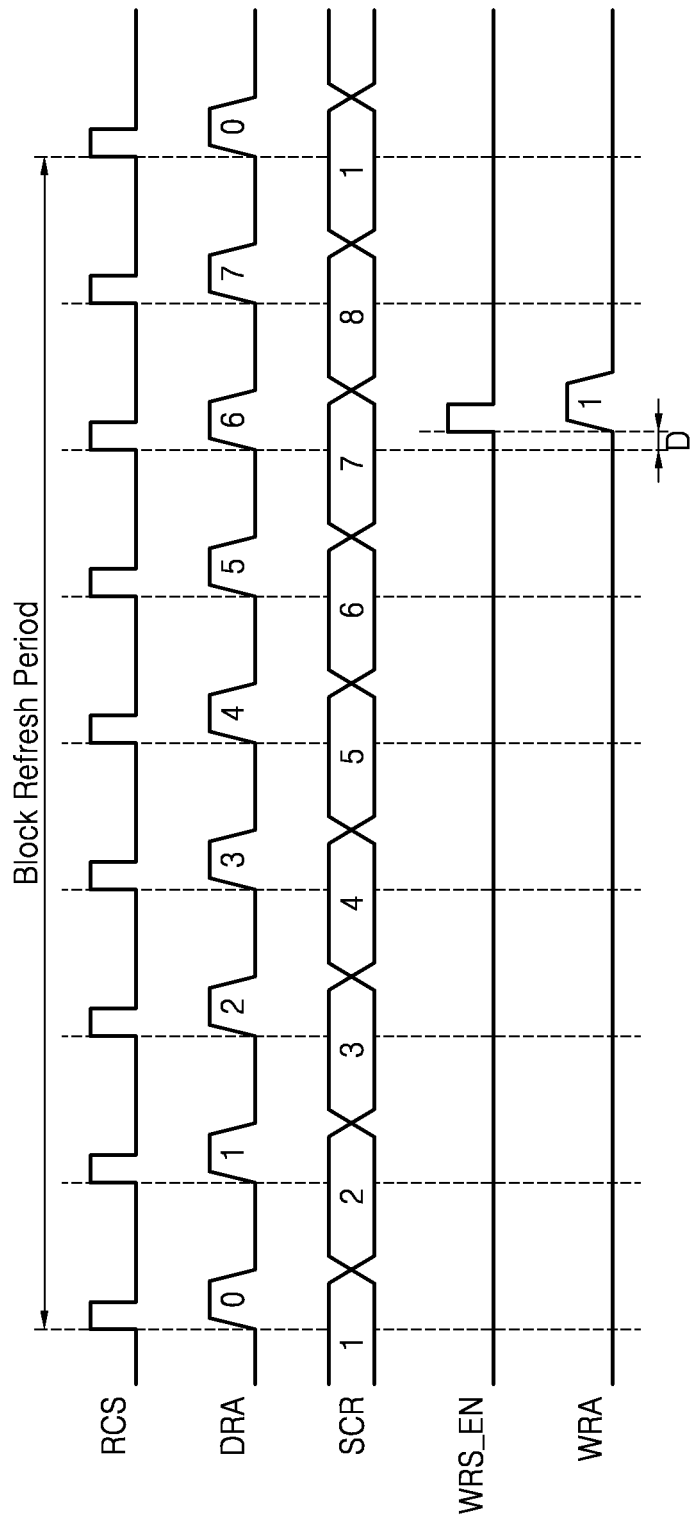
FIG. 8 is a timing chart showing the operation of the semiconductor memory device illustrated in FIG. 7.

FIG. 8 is a timing chart showing the operation of the semiconductor memory device 100" illustrated in FIG. 7. Referring to FIGS. 7 and 8, it is assumed that a memory cell array (not shown) included in the memory block 160 of the semiconductor memory device 100 illustrated in FIG. 7 includes 8 rows in total and a single refresh period is completed with a total of 8 refresh operations.

As illustrated in FIG. 8, 8 refresh commands may be generate during the refresh period. The default refresh controller 110 may receive the refresh commands and generate a default refresh address signal corresponding to each of row addresses sequentially from a row address of "0" to a row address of "7". The memory block 160 may perform a refresh on a plurality of memory cells at a row address of a memory cell array (not shown), which corresponds to each of sequentially generated delimit refresh address signals.

When a weak cell belongs to the row address of "1", the weak cell information WCI corresponding to the row address of "1" may be stored by the weak cell test circuit in the weak cell memory 150. In addition, the weak cell memory 150 may also store the weak cell refresh information WCRI indicating that the second default refresh operation is performed on the row address of "1" during the refresh period.

The signal counter 137 included in the weak cell refresh controller 136 may count the number of receptions of the default refresh address signal received from the default refresh controller 110 and generate a count result. When the count result is greater than the weak cell refresh information WCRI received from the weak cell memory 150 by a predetermined value, e.g., by 5 in the embodiments illustrated in FIG. 8, the signal counter 137 may output the signal counting result SCR at the logic high. The signal counter 137 may output the signal counting result SCR at the logic low until the result of counting the number of delimit refresh address signals is 7. When the count result is 7, the signal counter 137 may output the signal counting result SCR at the logic high.

The refresh determinator 138 may receive the signal counting result SCR and the weak cell information WCI and control the operation timing of the weak cell refresh address generator 139. In detail, the refresh determinator 138 may output the weak cell refresh enable signal WRS_EN a predetermined delay D after receiving the signal counting result SCR and the weak cell information WCI instead of immediately outputting the weak cell refresh enable signal WRS_EN.

The weak cell refresh address generator 139 may receive the weak cell refresh enable signal WRS_EN and the weak cell information WCI and generate the weak cell row address WRA of "1". In other words, the memory block 160 may substantially simultaneously perform a refresh of the row address DRA of "6" in response to the default refresh signal DRS (e.g., spaced with a refresh cycle time) and a refresh of the row address of "1" WRA in response to the weak cell refresh signal WRS (comprising the weak cell refresh enable signal WRS_EN and weak cell row address WRA).

According to the current embodiments, default refresh address signals are counted, so that in addition to a normal refresh, at least one more refresh is performed on a weak cell having a data retention time shorter than a refresh period. As a result, data loss is prevented.

Figure 9:
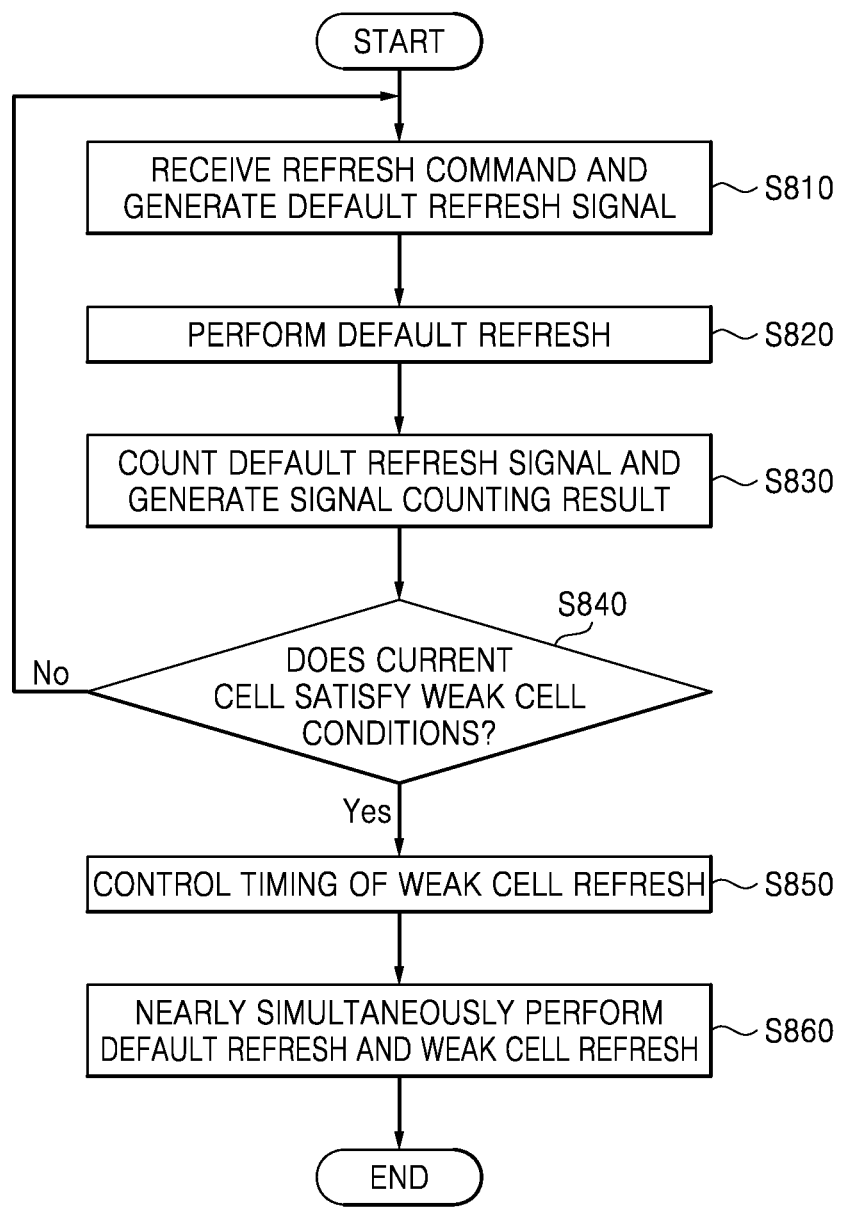
FIG. 9 is a flowchart of a method of refreshing memory cells according to other embodiments of the inventive concept.

FIG. 9 is a flowchart of the operations of the semiconductor memory device 100″ according to other embodiments of the inventive concept. Referring to FIGS. 7 through 9, the default refresh controller 110 may receive a refresh command and generate the default refresh signal DRS according to the refresh command in operation S810. The default refresh controller 110 may send the default refresh signal DRS to the memory block 160 and the weak cell refresh controller 136.

The memory block 160 may receive the default refresh signal DRS including a default refresh control signal RCS and a default refresh address signal DRA from the default refresh controller 110 and refresh a plurality of memory cells corresponding to the default refresh address signal DRA in response to the activation of the default refresh control signal RCS in operation S820.

The signal counter 137 included in the weak cell refresh controller 136 may receive the default refresh signal DRS from the default refresh controller 110 and the weak cell refresh information WCRI from the weak cell memory 150. The signal counter 137 may count the number of receptions the default refresh signal DRS (e.g., by counting the number of default refresh control signals RCS), generate a count result, compare the count result with the weak cell refresh information WCRI, and generate the signal counting result SCR. When the count result is the same as a value greater than the weak cell refresh information WCRI by a predetermined value, the signal counter 137 may output the signal counting result SCR at the logic high in operation S830. Contrarily, when the count result is not the same as a value greater than the weak cell refresh information. WCRI by a predetermined value, the signal counter 137 may output the signal counting result SCR at the logic low in operation S830. The inventive concept is not restricted to the current embodiments. It may be vice versa.

When the refresh of the weak cell is determined unnecessary, for instance, when the count result is not the same as a value greater than the weak cell refresh information WCRI by the predetermined value, the refresh of the weak cell may not be carried out and just a default refresh may be performed (the route of "NO" from operation S840).

When the refresh of the weak cell is determined necessary, for instance, when the count result is the same as a value greater than the weak cell refresh information WCRI by the predetermined value, the refresh determinator 138 and the weak cell refresh address generator 139 may operate (the route of "YES" from operation S840).

The refresh determinator 138 included in the weak cell refresh controller 136 may receive the signal counting result SCR and the weak cell information WCI and control the operation timing of the weak cell refresh address generator 139 in operation S850. For instance, when the signal counting result SCR for a current weak cell is at the logic high, the refresh determinator 138 may generate the weak cell refresh enable signal WRS EN for the current weak cell with reference to the weak cell information WCI.

The weak cell refresh address generator 139 included in the weak cell refresh controller 136 may receive the weak cell refresh enable signal WRS_EN and the weak cell information WCI and generate the weak cell refresh signal WRS in operation S860, in other words, the weak cell refresh address generator 139 may control the memory block 160 to perform at least one more refresh on the weak cell in addition to a default refresh during the refresh period.

A refresh by the default refresh controller 110 and a refresh by the weak cell refresh controller 136 may be performed simultaneously or may be performed with a time difference to disperse noise in the sense amplifier of the memory block 160.

Figure 10:
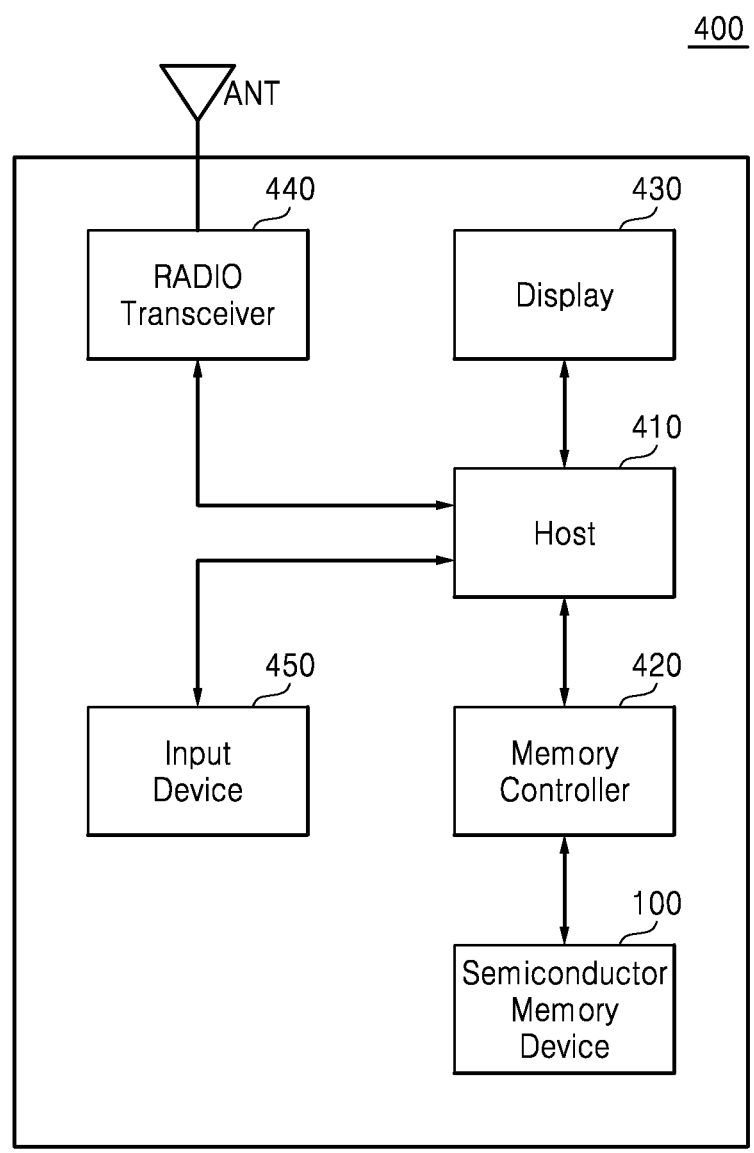
FIG. 10 is a block diagram of a computer system including the semiconductor memory device 100 illustrated in FIG. 1 according to some embodiments of the inventive concept.

FIG. 10 is a block diagram of a computer system 400 including the semiconductor memory device 100 illustrated in FIG. 1 according to some embodiments of the inventive concept. Referring to FIG. 10, the computer system 400 may be implemented as a cellular phone, a smart phone, a tablet personal computer (PC), a personal digital assistant (PDA) or a radio communication system.

The computer system 400 includes the semiconductor memory device 100 and a memory controller 420 controlling the operations of the semiconductor memory device 100. The memory controller 420 may control the data access operations, e.g., a program operation, an erase operation, and a read operation, of the semiconductor memory device 100 according to the control of a host 410.

The page data programmed in the semiconductor memory device 100 may be displayed through a display 630 according to the control of the host 410 and/or the memory controller 420.

A radio transceiver 440 transmits or receives radio signals through an antenna ANT. The radio transceiver 440 may convert radio signals received through the antenna ANT into signals that can be processed by the host 410. Accordingly, the host 410 may process the signals output from the radio transceiver 440 and transmit the processed signals to the memory controller 420 or the display 630. The memory controller 420 may program the signals processed by the host 410 to the semiconductor memory device 100. The radio transceiver 440 may also convert signals output from the host 410 into radio signals and outputs the radio signals to an external device through the antenna ANT.

An input device 450 enables control signals for controlling the operation of the host 410 or data to be processed by the host 410 to be input to the computer system 400. The input device 450 may be implemented by a pointing, device such as a touch pad or a computer mouse, a keypad, or a keyboard.

The host 410 may control the operation of the display 630 to display data output from the memory controller 420, data output from the radio transceiver 440, or data output from the input device 450. The memory controller 420, which controls the operations of the semiconductor memory device 100, may be implemented as a part of the host 410 or as a separate chip.

Figure 11:
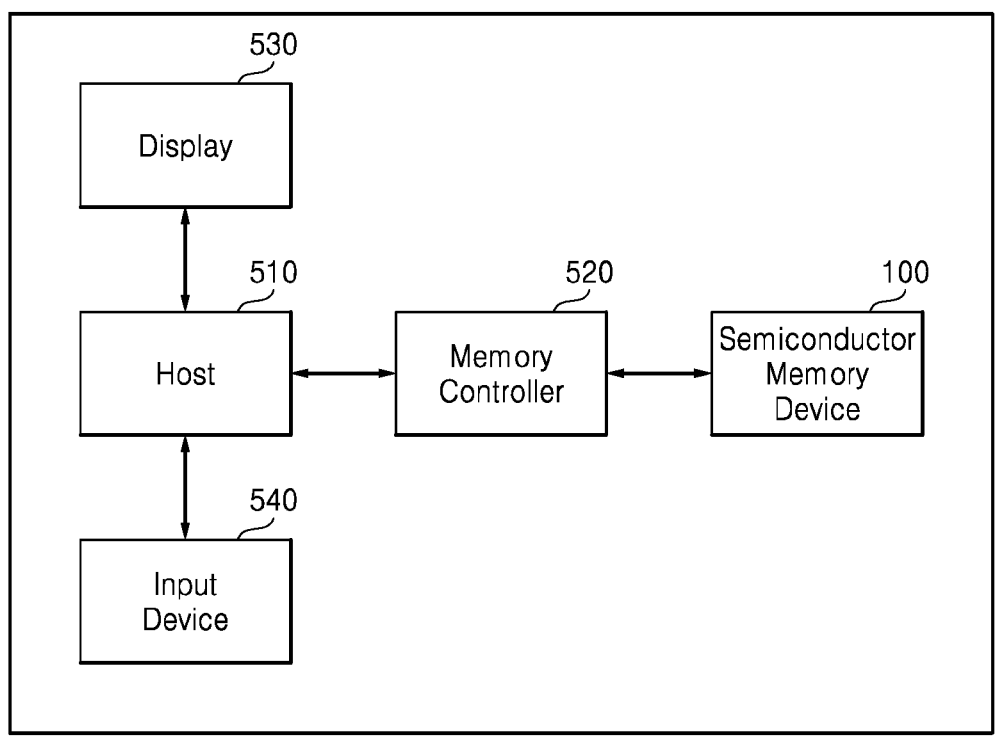
FIG. 11 is a block diagram of a computer system including the semiconductor memory device 100 illustrated in FIG. 1 according to other embodiments of the inventive concept.

FIG. 11 is a block diagram of a computer system 500 including the semiconductor memory device 100 illustrated in FIG. 1 according to other embodiments of the inventive concept. The computer system 500 may be implemented as a PC, a tablet PC, a net-book, an e-reader, a personal digital assistant (PDA), a portable multimedia player (PMP) an MP3 player, or an MP4 player.

The computer system 500 includes a host 510, the semiconductor memory device 100, a memory controller 520 controlling the data processing operations of the semiconductor memory device 100, a display 530 and an input device 540. The host 510 may display data stored in the semiconductor memory device 100 through the display 530 according to data input through the input device 540. The input device 540 may be implemented by a pointing device such as a touch pad or a computer mouse, a keypad, or a keyboard.

The host 510 may control the overall operation of the computer system 500 and the operations of the memory controller 520. The memory controller 520, which may control the operations of the semiconductor memory device 100, may be implemented as a part of the host 510 or as a separate chip.

Figure 12:
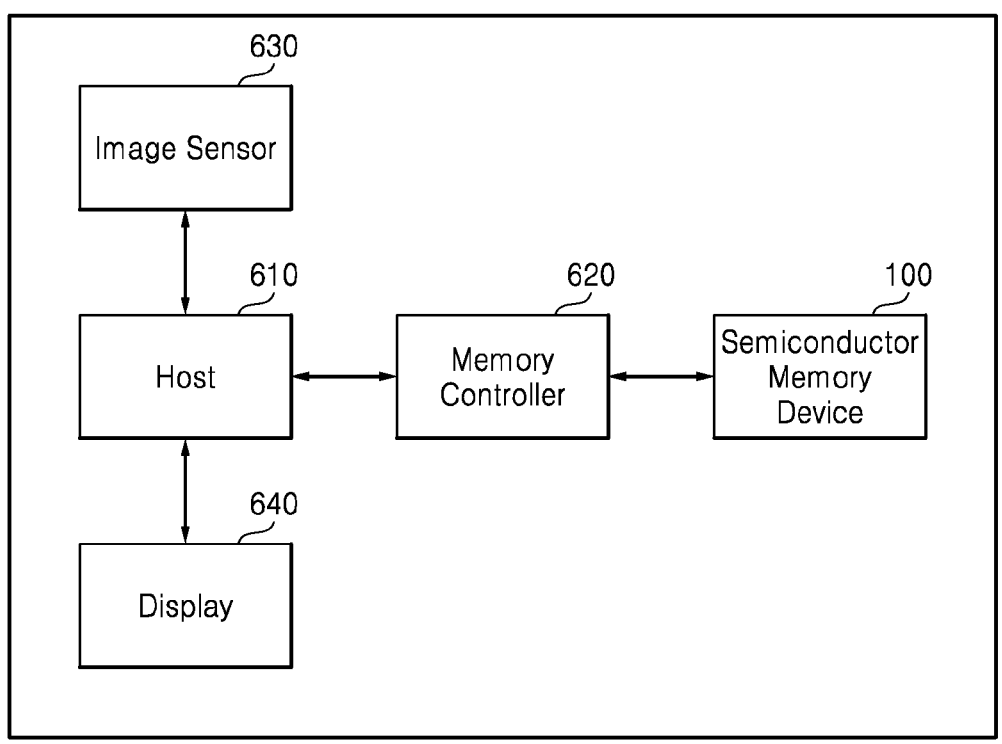
FIG. 12 is a block diagram of a computer system including the semiconductor memory device 100 illustrated in FIG. 1 according to other embodiments of the inventive concept.

FIG. 12 is a block diagram of a computer system 600 including the semiconductor memory device 100 illustrated in FIG. 1 according to other embodiments of the inventive concept. The computer system 600 may be implemented as an image processor like a digital camera, a cellular phone equipped with a digital camera, a smart phone equipped with a digital camera, or a tablet PC equipped with a digital camera.

The computer system 600 includes a host 610, the semiconductor memory device 100 and a memory controller 620 controlling the data processing operations, such as a program operation, an erase operation, and a read operation, of the semiconductor memory device 100. The computer system 600 further includes an image sensor 630 and a display 640.

The image sensor 630 included in the computer system 600 converts optical images into digital signals and outputs the digital signals to the host 610 or the memory controller 620. The digital signals may be controlled by the host 610 to be displayed through the display 630 or stored in the semiconductor memory device 100 through the memory controller 620.

Data stored in the semiconductor memory device 100 may be displayed through the display 630 according to the control of the host 610 or the memory controller 620. The memory controller 620, which may control the operations of the semiconductor memory device 100, may be implemented as a part of the host 610 or as a separate chip.

Figure 13:
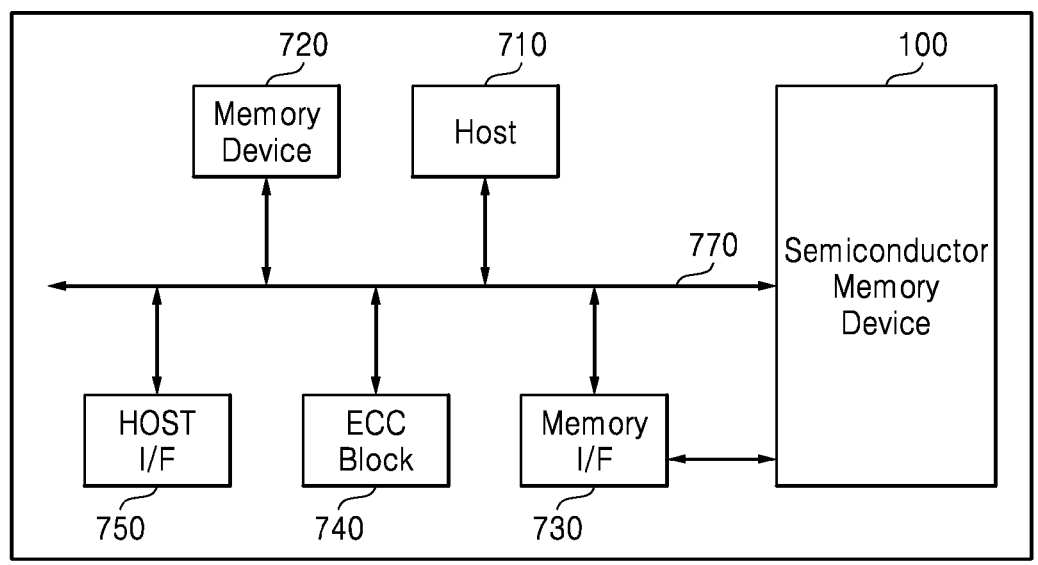
FIG. 13 is a block diagram of a computer system including the semiconductor memory device 100 illustrated in FIG. 1 according to yet other embodiments of the inventive concept.

FIG. 13 is a block diagram of a computer system 700 including the semiconductor memory device 100 illustrated in FIG. 1 according to yet other embodiments of the inventive concept. The computer system 700 includes the semiconductor memory device 100 and a host 710 controlling the operations of the semiconductor memory device 100. The semiconductor memory device 100 may be a non-volatile memory such as flash memory. The computer system 700 also includes a system memory 720, a memory interface 730, an error correction code (FCC) block 740 and a host interface 750.

The system memory 720 may be used an operation memory of the host 710. The system memory 720 may be implemented by a non-volatile memory like read-only memory (ROM) or a volatile memory like static random access memory (SRAM). The host 710 connected with the computer system 700 may perform data communication with the semiconductor memory device 100 through a memory interface 730 and a host interface 750.

The ECC block 740 is controlled by the host 710 to detect an error bit included in data output from the semiconductor memory device 100 through the memory interface 730, correct the error bit, and transmit the error-corrected data to the host 710 through the host interface 750. The host 710 may control data communication among the memory interface 730, the ECC block 740, the host interface 750, and the system memory 720 through a bus 770. The computer system 700 may be implemented as a flash memory drive, a USB memory drive, an IC-USB memory drive, or a memory stick.

Figure 14:
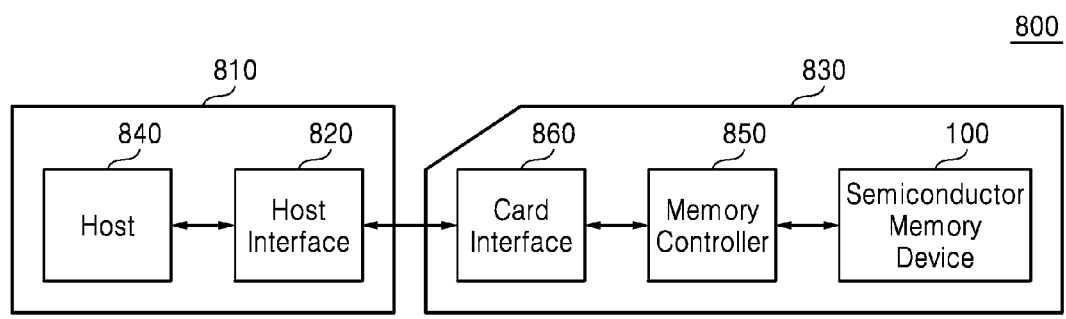
FIG. 14 is a block diagram of a computer system including the semiconductor memory device 100 illustrated in FIG. 1 according to still other embodiments of the inventive concept.

FIG. 14 is a block diagram of a computer system 800 including the semiconductor memory device 100 illustrated in FIG. 1 according to further embodiments of the inventive concept. The computer system 800 may be implemented as a memory card or a smart card. The computer system 800 includes a host computer 810 and a memory card 830.

The host computer 810 includes a host 840 and a host interface 820. The memory card 830 includes the semiconductor memory device 100, a memory controller 850, and a card interface 860. The memory controller 850 may control data exchange between the semiconductor memory device 100 and the card interface 860. The card interface 860 may be a secure digital (SD) card interface or a multi-media card (MMC) interface, but the inventive concept is not restricted to the current embodiments.

When the memory card 830 is connected with the host computer 810, the card interface 860 may interface the host 840 and the memory controller 850 for data exchange according to a protocol of the host 840. The card interface 860 may support a universal serial bus (USB) protocol and an interchip (IC)-USB protocol. Here, the card interface 860 may indicate a hardware supporting a protocol used by the host computer 810, a software installed in the hardware, or a signal transmission mode.

When the computer system 800 is connected with the host interface 820 of the host computer 810 such as a PC, a tablet PC, a digital camera, a digital audio player, a cellular phone, a console video game hardware, or a digital set-top box, the host interface 820 may perform data communication with the semiconductor memory device 100 through the card interface 860 and the memory controller 850 according to the control of the host 840.

Figure 15:
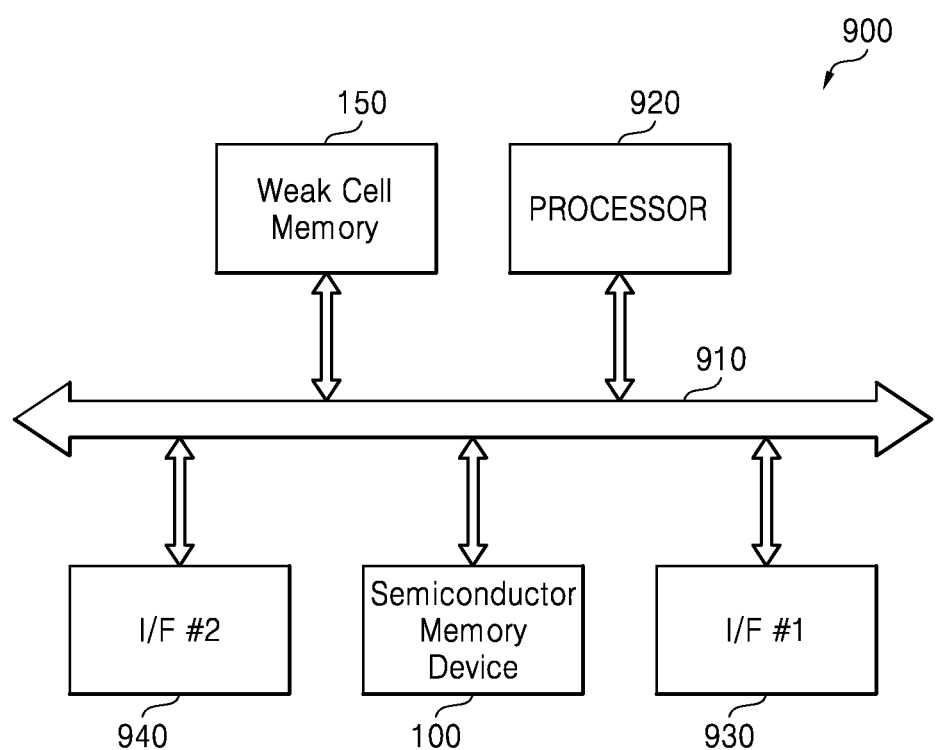
FIG. 15 is a block diagram of a computer system including the semiconductor memory device 100 illustrated in FIG. 1 according to still other embodiments of the inventive concept.

FIG. 15 is a block diagram of a computer system 900 including the semiconductor memory device 100 illustrated in FIG. 1 according to yet other embodiments of the inventive concept. The computer system 900 includes the semiconductor memory device 100 connected to a data bus 910, a weak cell memory 150, a processor 920, a first interface 930 and a second interface 940.

According to some embodiments, the computer system 900 may include a portable device such as a mobile phone, an MP3 player, an MP4 player, a personal digital assistant (PDA), or a portable multimedia player (PMP).

According to other embodiments, the computer system 900 may include a data processing system such as a personal computer (PC), a notebook-sized personal computer, or a laptop computer.

According to yet other embodiments, the computer system 900 may include a memory card such as a secure digital (SD) card, or a multi-media card (MMC).

According to still other embodiments, the computer system 900 may include a smart digital card, or a solid state drive (SSD).

The semiconductor memory device 100, the weak cell memory 150 and the processor 920 may be implemented as a single chip, e.g., a system on chip (SOC), or as separate devices.

The processor 920 may process data input via the first interface 930 and write the processed data in the semiconductor memory device 100. Furthermore, if there some needs to refresh the semiconductor memory device 100, the semiconductor memory device 100 may receive weak cell information (WCI) and weak cell refresh information (WCRI) via the data bus 910. In FIG. 15, the weak cell memory 150 is implemented outside the semiconductor memory device 100. However, the weak cell memory 150 may be implemented inside the semiconductor memory device 100.

The processor 920 may read data stored in the semiconductor memory device 100 and output the read data via the first interface. In this case, the second interface 920 may be input/output device.

The second interface 920 may be an interface for wireless communication. According to some embodiments, the second interface 920 may be implemented as software or firmware.

Figure 16:
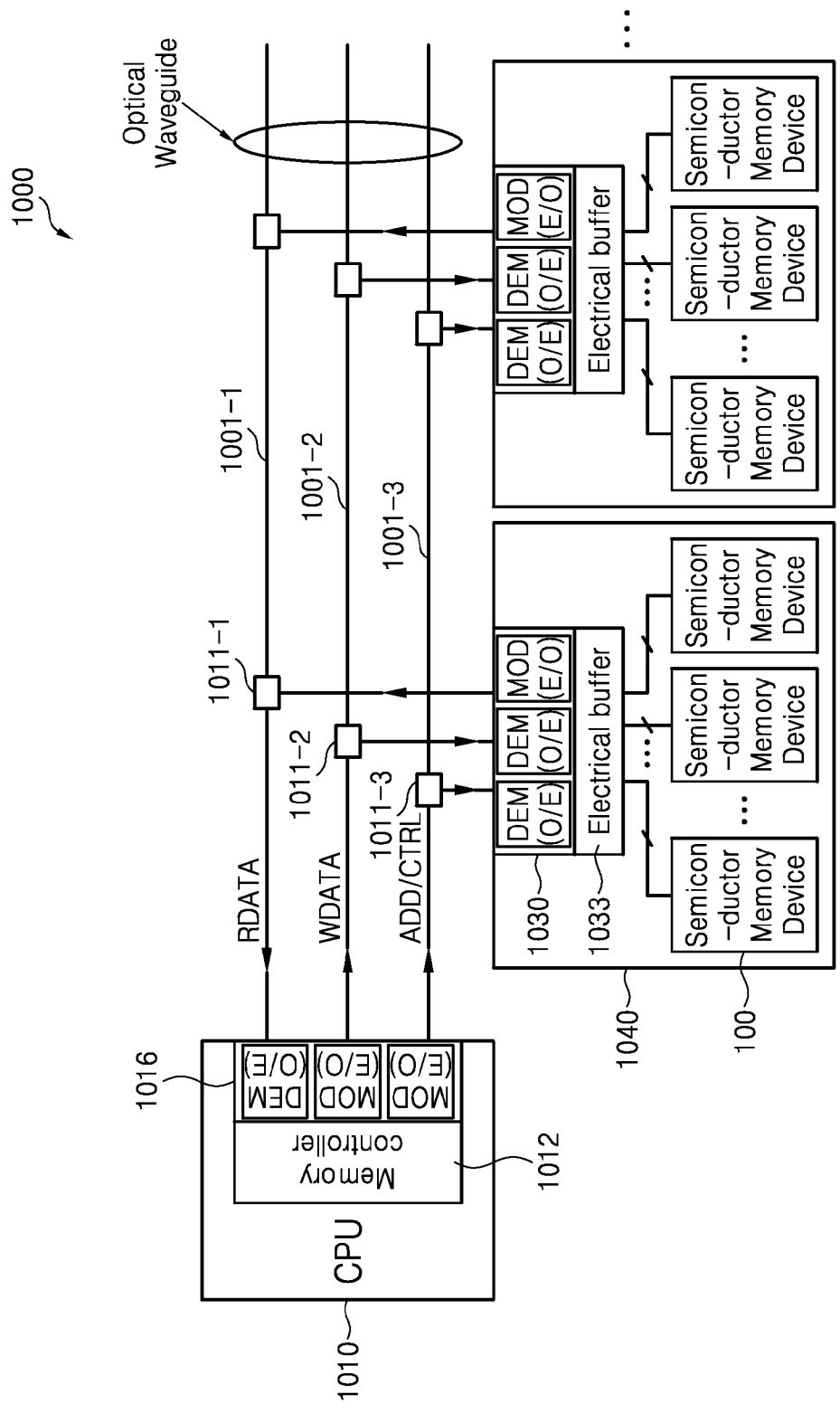
FIG. 16 is a block diagram of a data processing system including the semiconductor memory device 100 illustrated in FIG. 1 according to some embodiments of the inventive concept.

FIG. 16 is a block diagram of a data processing system including the semiconductor memory device 100 illustrated in FIG. 1 according to some embodiments of the inventive concept.

In FIG. 16, MOD(E/O) denotes an optical modulator performing E/O conversion, and DEM(O/E) denotes an optical demodulator performing O/E conversion.

Referring FIG. 16, the data processing system 1000 includes a central processing unit (CPU) 1010, a plurality of data buses 1001-1, 1001-2, and 1001-3, and a plurality of memory modules 1040. The data buses 1001-1 through 1001-3 transmit signals electrically or optically.

The memory modules 1040 transmit and receive optical signals through a plurality of couplers 1011-1, 1011-2, and 1011-3 respectively connected to the data buses 1001-1 through 1001-3. Each of the couplers 1011-1 through 1011-3 may be implemented by an electrical coupler or an optical coupler.

The CPU 1310 includes a first optical transceiver 1016, which includes at least one optical modulator MOD(E/O) and at least one optical demodulator DEM(O/E), and a memory controller 1012. The optical demodulator DEM(O/E) is used as an O/E converter. The memory controller 1012 is controlled by the CPU 1010 to control the operations, e.g., the transmitting operation and the receiving operation, of the first optical transceiver 1016.

For instance, during a write operation, a first optical modulator MOD(E/O) of the first optical transceiver 1016 generates a modulated optical signal ADD/CTRL from addresses and control signals, and transmits the optical signal ADD/CTRL to the data bus 1001-3. After the first optical transceiver 1016 transmits the optical signal ADD/CTRL to the data bus 1001-3, a second optical modulator MOD(E/O) of the first optical transceiver 1016 generates modulated optical write data WDATA and transmits the optical write data WDATA to the data bus 1001-2.

Each of the memory modules 1040 includes a second optical transceiver 1030 and a plurality of memory devices 100. Each memory module 1040 may be implemented by an optical dual in-line memory module (DIMM), an optical fully buffered DIMM, an optical small outline dual in-line memory module (SO-DIMM), an optical registered DIMM (RDIMM), an optical load reduced DIMM (LRDIMM), an optical unbuffered DIMM (UDIMM), an optical micro DIMM, or au optical single in-line memory module (SIMM).

Referring to FIG. 16, art optical demodulator DEM(O/E) included in the second optical transceiver 1030 demodulates the optical write data WDATA received through the data bus 1001-2 and transmits a demodulated electrical signal to at least one of the memory devices 100.

Each memory module 1040 may also include an electrical buffer 1033 which buffers an electrical signal output from an optical demodulator DEM(O/E). For instance, the electrical buffer 1033 may buffer a demodulated electrical signal and transmits the buffered electrical signal to at least one of the memory devices 100.

During a read, operation, an electrical signal output from a memory device 100 is modulated into optical read data RDATA by an optical modulator MOD(E/O) included in the second optical transceiver 1030. The optical read data RDATA is transmitted to a first optical demodulator DEM (O/E) included in the CPU 1010 through the data bus 1001-1. The first optical demodulator DEM(O/E) demodulates the optical read data RDATA and transmits a demodulated electrical signal to the memory controller 1012.

Figure 17:
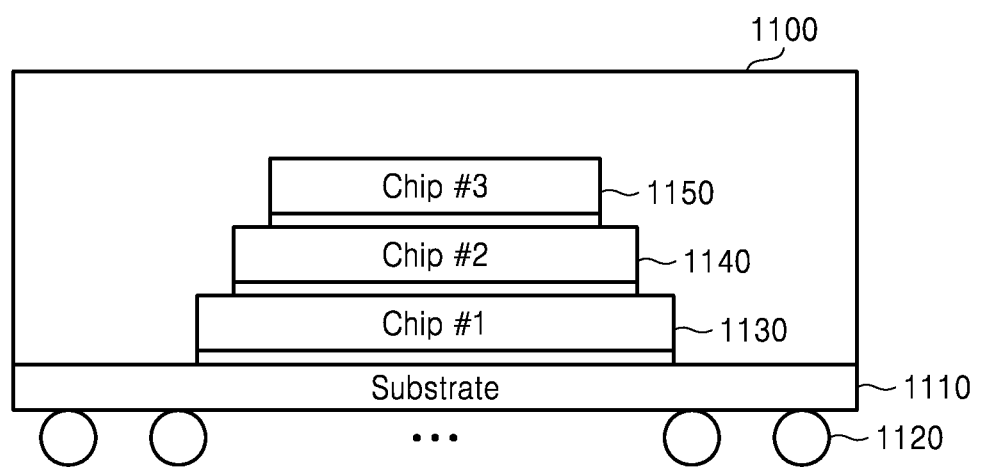
FIG. 17 is a schematic conceptual diagram of a multi-chip package including the semiconductor memory device illustrated in FIG. 1.

FIG. 17 is a schematic conceptual diagram of a multi-chip package 1100 including the semiconductor memory device 100 illustrated in FIG. 1. Referring to FIG. 10, the multi-chip package 1100 may include a plurality of semiconductor devices, i.e., first through third chips 1130, 1140, and 1150 which are sequentially stacked on a package substrate 1110. Each of the semiconductor devices 1130 through 1150 may include the semiconductor memory device 100. A memory controller (not shown) for controlling the operations of the semiconductor devices 1130 through 1150 may be included within at least one of the semiconductor devices 1130 through 1150 or may be implemented on the package substrate 1110. A through-silicon via (TSV) (not shown), a bonding wire (not shown), a bump (not shown), or a solder ball 1120 may be used to electrically connect the semiconductor devices 1130 through 1150 with one other.

The first semiconductor device 1130 may be a logic die including an input/output interface and a memory controller and the second and third semiconductor devices 1140 and 1150 may be a die, on which a plurality of memory devices are stacked, and may include a memory cell array. At this time, a memory device of the second semiconductor device 1140 and a memory device of the third semiconductor device 1150 may be the same or different types of memory.

Alternatively, each of the first through third semiconductor devices 1130 through 1150 may include a memory controller. At this time, the memory controller may be on the same die as a memory cell array or may be on a different die than the memory cell array.

As another alternative, the first semiconductor device 1130 may include an optical interface. A memory controller may be positioned in the first or second semiconductor device 1130 or 1140 and a memory device may be positioned in the second or third semiconductor device 1140 or 1150. The memory device may be connected with the memory controller through a TSV.

The multi-chip package 1100 may be implemented using hybrid memory cube (HMC) in which a memory controller and a memory cell array die are stacked. When the HMC is used, the performance of memory devices increases due to the increase of bandwidth and the area of the memory devices is minimized. As a result, power consumption and manufacturing cost can be reduced.

Figure 18:
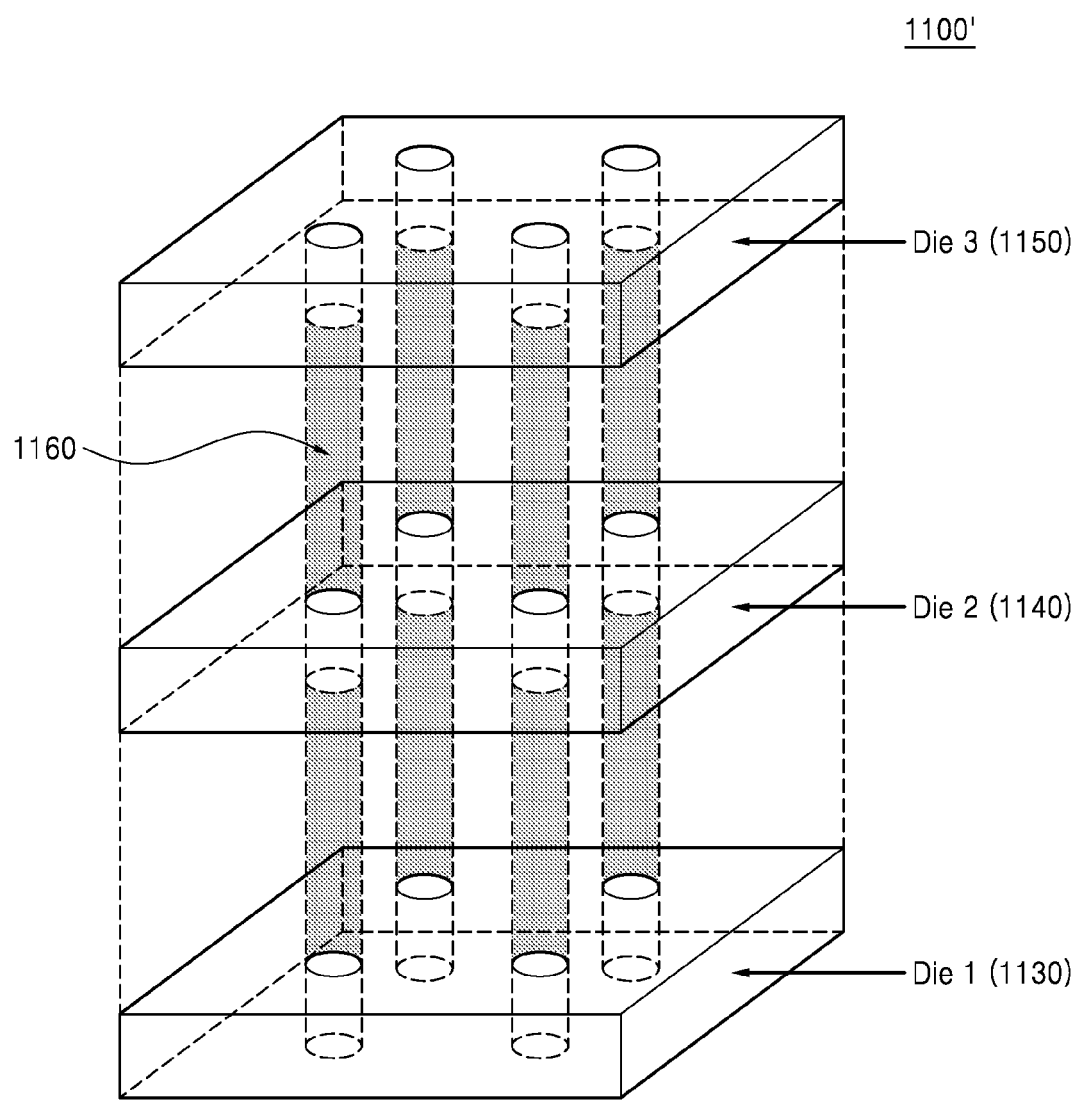
FIG. 18 is a three-dimensional conceptual diagram of an example 1100' of the multi-chip package 1100 illustrated in FIG. 17.

FIG. 18 is a three-dimensional conceptual diagram of an example 1100' of the multi-chip package 1100 illustrated in FIG. 17. Referring to FIG. 18, the multi-chip package 1100' includes a plurality of the dies 1130 through 1150 connected with one another through TSVs 1160 in a stack structure. Each of the dies 1130 through 1150 may include a plurality of circuit blocks (not shown) and a periphery circuit to realize the functions of the semiconductor memory device 100. The dies 1130 through 1150 may be referred to as a cell array. The plurality of circuit blocks may be implemented by memory blocks.

The TSVs 1160 may be formed of a conductive material including a metal such as copper (Cu). The TSVs 1160 are arranged at the center of a silicon substrate. The silicon substrate surrounds the TSVs 1160. An insulating region (not shown) may be disposed between the TSVs 1160 and the silicon substrate.

As described above, according to some embodiments of the inventive concept, a semiconductor memory device performs at least one more refresh on a weak cell having a data retention time shorter than a refresh period apart from a normal default refresh, thereby preventing data loss.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A method of refreshing a memory device comprising a plurality of volatile memory cells and a nonvolatile memory storing at least a first address, the first address corresponding to a first group of the plurality of volatile memory cells, the method comprising:

in response to each of a series of refresh commands, refreshing a corresponding group of volatile memory cells corresponding to each refresh command; and in response to a first refresh command of the series of refresh commands and in response to accessing the first address stored in the nonvolatile memory, refreshing the first group of volatile memory cells, wherein the first refresh command corresponds to a second group of volatile memory cells other than the first group of volatile memory cells, the second group of volatile memory cells having a second row address, the second group of volatile memory cells being refreshed in response to the first refresh command, and wherein refreshing the first group of memory cells is performed in response to comparing only part of the second row address that does not include at least one bit of the second row address with corresponding address bits of the first address to determine if the first address matches the part of the second row address.

2. The method of claim 1, wherein the nonvolatile memory stores information indicating a place of an additional refresh operation of the first group of volatile memory cells within a refresh sequence.

3. The method of claim 1, wherein the first address corresponding to the first row of volatile memory cells is a complete row address of the first row.

4. The method of claim 1, wherein the at least one bit of the second row address is the most significant bit of the second row address.

5. A method of refreshing a memory device comprising a plurality of volatile memory cells and a nonvolatile memory storing at least a first address, the first address identifying a first group of the plurality of volatile memory cells, the method comprising:

receiving a series of refresh commands from a source external to the memory device, each of the refresh commands identifying a group of volatile memory cells to be refreshed;

in response to each of the series of refresh commands, refreshing the group of volatile memory cells identified by the corresponding refresh command; and in response to a first refresh command of the series of refresh commands and in response to accessing the first address stored in the nonvolatile memory, refreshing the first group of volatile memory cells, wherein the first refresh command identifies a second group of volatile memory cells other than the first group of volatile memory cells, wherein the nonvolatile memory stores information indicating a place of an additional refresh operation of the first group of volatile memory cells within a refresh sequence, wherein the refreshing of the first group of volatile memory cells is performed a predetermined period of time after a refresh of the second group of volatile memory cells.

6. A method of refreshing a volatile memory device, the memory device comprising a plurality of cell rows of volatile memory cells and a nonvolatile memory storing address information, including a first address, identifying weak cell rows of the plurality of cell rows, the method comprising:

during a first period having a first duration:

(a) for each of the plurality of cell rows, in response to receiving an external refresh command including an address identifying the cell row, performing a default refresh operation of the cell row corresponding to the address of the received refresh command;

(b) for each of the weak cell rows identified by address information stored in the weak cell memory and in response to the address information stored in the weak cell memory, performing a refresh operation of the respective weak cell row in addition to the default refresh operation performed in step (a);

(c) for each of the received external refresh commands, comparing address bits except the most significant bit of an address received with the respective external refresh command with address bits except the most significant bit of the address of each of the weak cell rows, to determine if the address received with the respective external refresh command is at least partly matching with an address of the weak cell rows, wherein step (b) performs the refresh operation of the respective weak cell row in response to step (c).

7. The method of claim 6, further comprising modifying a count in response to the receipt of the external refresh commands received during the first period, wherein the timing of the refresh operation of the respective weak cell row of step (b) is responsive to the count.

8. A method of refreshing a volatile memory device, the memory device comprising a plurality of cell rows of volatile memory cells and a nonvolatile memory storing address information, including a first address, identifying weak cell rows of the plurality of cell rows, the method comprising:

during a first period having a first duration:

(a) for each of the plurality of cell rows, in response to receiving an external refresh command including an address identifying the cell row, performing a default refresh operation of the cell row corresponding to the address of the received refresh command;

(b) for each of the weak cell rows identified by address information stored in the weak cell memory and in response to the address information stored in the weak cell memory, performing a refresh operation of the respective weak cell row in addition to the default refresh operation performed in step (a); and during a second period of the first duration immediately following the first period, repeating steps (a) and (b).

9. The method of claim 8, wherein the performing of the refresh operation of the respective weak cell row in step (b) is performed in response to comparing only part of the row address of the received refresh command that does not include a most significant bit of the row address of the received refresh command with corresponding bits of the first address.

10. The method of claim 9, wherein the first address corresponding to the first weak cell row is a complete row address of the first weak cell row.

\* \* \* \* \*